United States Patent
Yamazaki

(10) Patent No.: US 9,275,858 B2
(45) Date of Patent: Mar. 1, 2016

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/309,198

(22) Filed: Jun. 19, 2014

(65) Prior Publication Data
US 2014/0302638 A1 Oct. 9, 2014

Related U.S. Application Data

(62) Division of application No. 13/167,049, filed on Jun. 23, 2011, now Pat. No. 8,766,252.

(30) Foreign Application Priority Data

Jul. 2, 2010 (JP) ................................ 2010-152050
Aug. 16, 2010 (JP) ................................ 2010-181523

(51) Int. Cl.
*H01L 21/00* (2006.01)
*H01L 21/16* (2006.01)
(Continued)

(52) U.S. Cl.
CPC .... *H01L 21/02565* (2013.01); *H01L 21/02488* (2013.01); *H01L 21/02554* (2013.01);
(Continued)

(58) Field of Classification Search
CPC .................. H01L 21/02554; H01L 21/02565; H01L 21/02488; H01L 29/247; H01L 29/2206; H01L 29/66969; H01L 29/78693

USPC ............................... 438/85, 86, 104, 149, 754
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2180518 A 4/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Hung Vu
(74) *Attorney, Agent, or Firm* — Eric J. Robinson; Robinson Intellectual Property Law Office, P.C.

(57) ABSTRACT

A semiconductor device having favorable electric characteristics and a manufacturing method thereof are provided. A transistor includes an oxide semiconductor layer formed over an insulating layer, a source electrode layer and a drain electrode layer which overlap with part of the oxide semiconductor layer, a gate insulating layer in contact with part of the oxide semiconductor layer, and a gate electrode layer over the gate insulating layer. In the transistor, a buffer layer having n-type conductivity is formed between the source electrode layer and the oxide semiconductor layer and between the drain electrode layer and the oxide semiconductor layer. Thus, parasitic resistance is reduced, resulting in improvement of on-state characteristics of the transistor.

22 Claims, 13 Drawing Sheets

(51) Int. Cl.
*H01L 21/02* (2006.01)
*H01L 29/22* (2006.01)
*H01L 29/24* (2006.01)
*H01L 29/45* (2006.01)
*H01L 29/66* (2006.01)
*H01L 29/786* (2006.01)
*H01L 27/12* (2006.01)

(52) U.S. Cl.
CPC ......... *H01L29/2206* (2013.01); *H01L 29/247* (2013.01); *H01L 29/45* (2013.01); *H01L 29/66969* (2013.01); *H01L 29/7869* (2013.01); *H01L 29/78618* (2013.01); *H01L 29/78693* (2013.01); *H01L 27/1225* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,332,383 B2 * | 2/2008 | Fang et al. .................... 438/149 |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,872,261 B2 | 1/2011 | Ikeda |
| 8,063,421 B2 | 11/2011 | Kang et al. |
| 8,236,635 B2 | 8/2012 | Suzawa et al. |
| 8,278,162 B2 * | 10/2012 | Akimoto et al. ............... 438/158 |
| 8,343,817 B2 | 1/2013 | Miyairi et al. |
| 8,421,068 B2 | 4/2013 | Yamazaki et al. |
| 8,421,069 B2 | 4/2013 | Yamazaki et al. |
| 8,441,007 B2 | 5/2013 | Arai |
| 8,624,237 B2 | 1/2014 | Yamazaki et al. |
| 8,629,434 B2 | 1/2014 | Arai |
| 8,729,546 B2 | 5/2014 | Suzawa et al. |
| 8,729,547 B2 | 5/2014 | Miyairi et al. |
| 8,785,242 B2 * | 7/2014 | Yamazaki et al. ............ 438/104 |
| 8,946,703 B2 | 2/2015 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025676 A1 | 2/2010 | Yamazaki et al. |
| 2010/0025677 A1 | 2/2010 | Yamazaki et al. |
| 2010/0025678 A1 | 2/2010 | Yamazaki et al. |
| 2010/0025679 A1 | 2/2010 | Yamazaki et al. |
| 2010/0032665 A1 | 2/2010 | Yamazaki et al. |
| 2010/0032666 A1 | 2/2010 | Yamazaki et al. |
| 2010/0032667 A1 | 2/2010 | Yamazaki et al. |
| 2010/0032668 A1 | 2/2010 | Yamazaki et al. |
| 2010/0035379 A1 | 2/2010 | Miyairi et al. |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0117078 A1 | 5/2010 | Kuwabara et al. |
| 2010/0133530 A1 | 6/2010 | Akimoto et al. |
| 2010/0163867 A1 | 7/2010 | Yamazaki et al. |
| 2010/0193783 A1 | 8/2010 | Yamazaki et al. |
| 2010/0213461 A1 | 8/2010 | Akimoto et al. |
| 2010/0219410 A1 | 9/2010 | Godo et al. |
| 2010/0244031 A1 | 9/2010 | Akimoto et al. |
| 2010/0264412 A1 | 10/2010 | Yamazaki et al. |
| 2010/0301328 A1 | 12/2010 | Yamazaki et al. |
| 2011/0115763 A1 | 5/2011 | Yamazaki et al. |

(56) References Cited

U.S. PATENT DOCUMENTS

| | | |
|---|---|---|
| 2012/0273780 A1 | 11/2012 | Yamazaki et al. |
| 2015/0048371 A1 | 2/2015 | Miyairi et al. |

FOREIGN PATENT DOCUMENTS

| | | |
|---|---|---|
| EP | 2226847 A | 9/2010 |
| JP | 60-198861 A | 10/1985 |
| JP | 61-248564 A | 11/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-031668 A | 2/2005 |
| JP | 2006-005116 A | 1/2006 |
| JP | 2006-058680 A | 3/2006 |
| JP | 2006-165528 A | 6/2006 |
| JP | 2008-219008 A | 9/2008 |
| JP | 2010-056542 A | 3/2010 |
| JP | 2010-062549 A | 3/2010 |
| JP | 2010-098280 A | 4/2010 |
| JP | 2010-123936 A | 6/2010 |
| JP | 2010-135777 A | 6/2010 |
| JP | 2010-135778 A | 6/2010 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUs on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, No. 1, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 84, No. 11, pp. 1993-1995.

International Search Report (Application No. PCT/JP2011/064990) Dated Sep. 20, 2011.

Written Opinion (Application No.PCT/JP2011/064990) Dated Sep. 20, 2011.

\* cited by examiner

SEMICONDUCTOR DEVICE AND MANUFACTURING METHOD THEREOF

TECHNICAL FIELD

The present invention relates to a semiconductor device using an oxide semiconductor and a manufacturing method thereof.

In this specification, the semiconductor device indicates all the devices that can function by utilizing semiconductor characteristics. For example, a transistor is a semiconductor device. An electro-optical device such as a liquid crystal display device and a light-emitting device, a semiconductor circuit, an electronic appliance, and the like which include the transistor are also semiconductor devices.

BACKGROUND ART

Attention has been focused on a technique for forming a transistor using a semiconductor thin film formed over a substrate having an insulating surface. Such a transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

Further, a transistor using an oxide semiconductor operates faster than a transistor using amorphous silicon. The transistor using an oxide semiconductor can be included in a driver circuit, a high-speed memory circuit, and the like of a display device.

REFERENCE

[Patent Document 1] Japanese Published Patent Application No. 2006-165528

DISCLOSURE OF INVENTION

For example, high speed operation is required for a transistor used for a driver circuit of a display device. In particular, as the definition of a display portion is increased, writing time of a display image is reduced. Therefore, for a transistor used in a driver circuit, a transistor having high on-state current and capable of high-speed operation is desired.

Thus, an object of one embodiment of the present invention is to provide a transistor having high on-state current and capable of high-speed operation and to provide a manufacturing method of the transistor. In addition, another object is to provide a semiconductor device including the transistor.

According to one embodiment of the present invention, a buffer layer having n-type conductivity is formed between an oxide semiconductor layer which is a channel formation region of a transistor and a metal layer which is a source electrode layer or a drain electrode layer; thus, parasitic resistance is reduced, resulting in improvement of on-state characteristics of the transistor.

One embodiment of the present invention disclosed in this specification is a semiconductor device including: an oxide semiconductor layer formed over an insulating layer; a source electrode layer and a drain electrode layer which overlap with part of the oxide semiconductor layer; a gate insulating layer in contact with part of the oxide semiconductor layer; and a gate electrode layer over the gate insulating layer. A buffer layer having n-type conductivity is formed between the source electrode layer and the oxide semiconductor layer and between the drain electrode layer and the oxide semiconductor layer.

For the above described source electrode layer and drain electrode layer, a single film containing an element selected from aluminum, chromium, copper, tantalum, titanium, molybdenum, and tungsten as its main component, an alloy film containing any of these elements, or a layered film including any of the films can be used.

Further, for the above described buffer layer, a metal oxide selected from indium oxide, indium tin oxide, indium zinc oxide, tin oxide, zinc oxide, and tin zinc oxide, or a material including the metal oxide which contains one or more elements selected from aluminum, gallium, and silicon can be used. With such a structure, the parasitic resistance between the source electrode layer and drain electrode layer and the oxide semiconductor layer can be reduced.

Another embodiment of the present invention disclosed in this specification is a method for manufacturing a semiconductor device including the following steps: forming an insulating layer over a substrate having an insulating surface; forming an island-shaped oxide semiconductor layer over the insulating layer; forming a buffer layer having n-type conductivity and a metal layer over the oxide semiconductor layer; forming a source region and a drain region which include the buffer layer and the metal layer so as to overlap with part of the oxide semiconductor layer by selectively etching the buffer layer and the metal layer; forming a gate insulating layer so as to cover the oxide semiconductor layer, the source region, and the drain region; and forming a gate electrode layer over the gate insulating layer so as to overlap with part of the oxide semiconductor layer.

According to one embodiment of the present invention, the parasitic resistance between the oxide semiconductor layer and the metal layer which is used as the source electrode layer and the drain electrode layer can be reduced. Consequently, a semiconductor device including a transistor having high on-state current and capable of high-speed operation and a manufacturing method of the semiconductor device can be provided.

BEST MODE FOR CARRYING OUT THE INVENTION

Figure 1A:
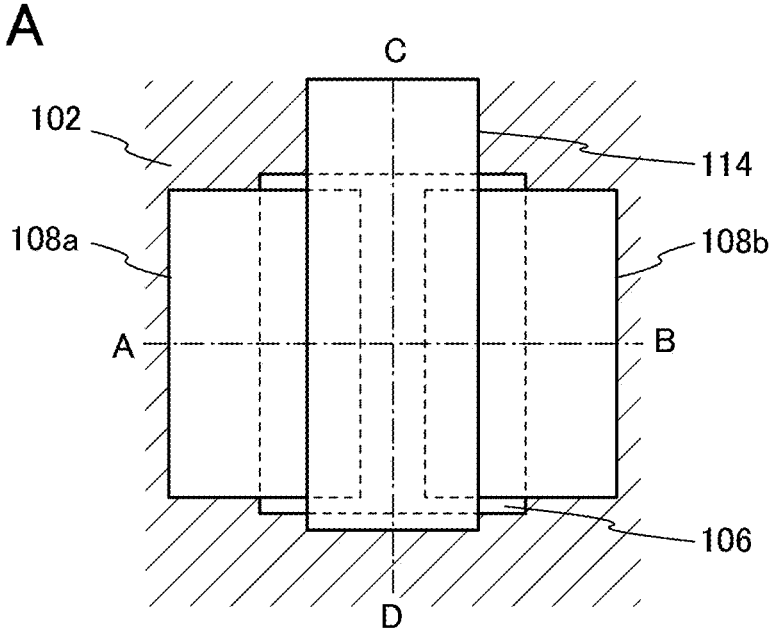
FIG. 1A is a plan view of a semiconductor device and FIGS. 1B and 1C are cross-sectional views of the semiconductor device.

Hereinafter embodiments of the present invention will be described in detail with reference to the accompanying drawings. Note that the present invention is not limited to the description below and it is easily understood by those skilled in the art that the mode and details can be changed variously. The present invention is not construed as being limited to description of the embodiments. In describing structures of the present invention with reference to the drawings, the same reference numerals are used in common for the same portions in different drawings. The same hatching pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, a semiconductor device and a manufacturing method of the semiconductor device each of which is one embodiment of the present invention will be described.

Figure 1B:
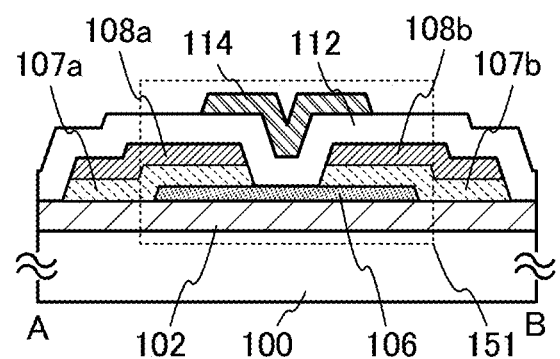
Figure 1C:
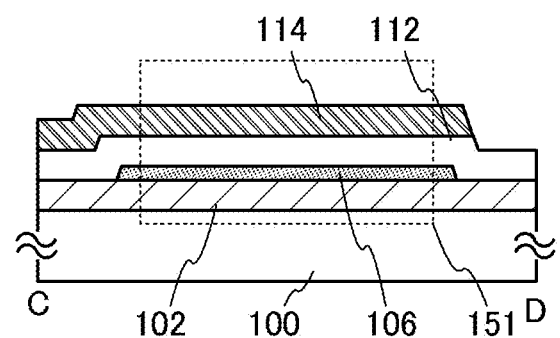

As an example of a semiconductor device which is one embodiment of the present invention, a plan view and cross-sectional views of a top-gate transistor are illustrated in FIGS. 1A to 1C. Here, FIG. 1A is a top view, FIG. 1B is a cross-sectional view along A-B of FIG. 1A, and FIG. 1C is a cross-sectional view along C-D of FIG. 1A. A transistor 151 is referred to as a top-contact transistor as well as a top-gate transistor because a source region and a drain region of the transistor 151 are formed over and in contact with a semiconductor layer.

The transistor 151 in FIGS. 1A to 1C includes an insulating layer 102, an oxide semiconductor layer 106, a source electrode layer 108a, a drain electrode layer 108b, a gate insulating layer 112, and a gate electrode layer 114, which are over a substrate 100. A buffer layer 107a is formed between the oxide semiconductor layer 106 and the source electrode layer 108a. A buffer layer 107b is formed between the oxide semiconductor layer 106 and the drain electrode layer 108b. Note that in this specification, the source electrode layer 108a and the buffer layer 107a are collectively called the source region and the drain electrode layer 108b and the buffer layer 107b are collectively called the drain region for simple description in some cases. The transistor using an oxide semiconductor layer in this embodiment is an n-channel transistor.

Figure 8A:
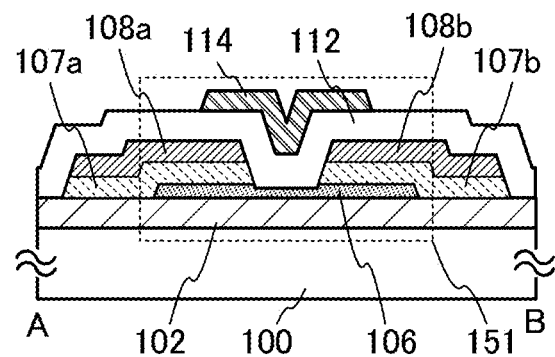
FIGS. 8A to 8C are cross-sectional views each illustrating a semiconductor device.
Figure 8B:
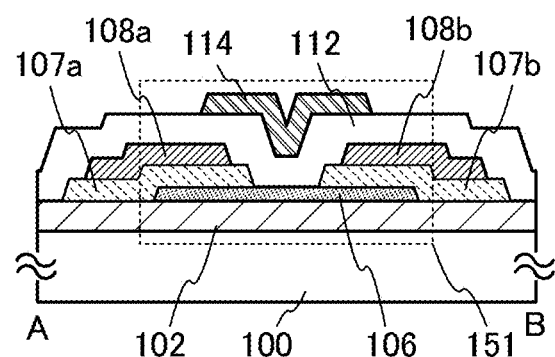
Figure 8C:
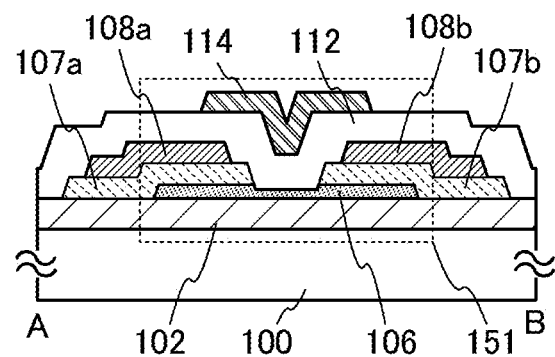

Note that the transistor 151 may have structures illustrated in cross-sectional views in FIGS. 8A to 8C. In FIG. 8A, a channel formation region of the oxide semiconductor layer 106 is formed to have a small thickness. In FIG. 8B, the source electrode layer 108a and the drain electrode layer 108b are formed to provide steps over the buffer layer 107a and the buffer layer 107b. FIG. 8C is a combination of FIGS. 8A and 8B. Transistors having these structures have electric characteristics equivalent to that of a transistor having a structure in the cross-sectional view in FIG. 1B.

For a material of the insulating layer 102, silicon oxide; silicon oxynitride; aluminum oxide, gallium oxide, or gallium aluminum oxide which is expressed by $Ga_xAl_{2-x}O_{3+y}$ ($0 \leq x \leq 2$ and $0 < y < 1$, i.e., x is greater than or equal to 0 and less than or equal to 2 and y is greater than 0 and less than 1); a mixed material of any of them; or the like can be used. Alternatively, the insulating layer 102 may be a stacked layer of the above material and silicon oxide, silicon nitride, silicon oxynitride, silicon nitride oxide, aluminum nitride, a mixed material of any of them, or the like. For example, a layered structure of a silicon nitride layer and a silicon oxide layer is used for the insulating layer 102, thereby preventing moisture from entering the transistor 151 from the substrate or the like. In the case where the insulating layer 102 is formed to have a layered structure, an oxide layer of silicon oxide, silicon oxynitride, aluminum oxide, a mixed material of any of them, or the like is preferably formed on a side where the insulating layer 102 is in contact with the oxide semiconductor layer 106. Note that the insulating layer 102 functions as a base layer of the transistor 151.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, the following can be used as the oxide semiconductor: indium oxide; tin oxide; zinc oxide; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a three-component metal oxide material such as an In—Ga—Zn—O-based material (also referred to as IGZO), an In—Al—Zn—O-based material, an In—Sn—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; or a four-component metal oxide material such as an In—Sn—Ga—Zn—O-based material, an In—Hf—Ga—Zn—O-based material, an In—Al—Ga—Zn—O-based material, an In—Sn—Al—Zn—O-based material, an In—Sn—Hf—Zn—O-based material, or an In—Hf—Al—Zn—O-based material.

Note that here, for example, an "In—Ga—Zn—O-based material" means an oxide containing In, Ga, and Zn as its main component and there is no particular limitation on the ratio of In:Ga:Zn. Further, a metal element in addition to In, Ga, and Zn may be contained.

For the oxide semiconductor layer, a thin film using a material represented by the chemical formula, $InMO_3(ZnO)_m$ (m>0, where m is not an integer), can be used. Here, M represents one or more metal elements selected from Zn, Ga, Al, Mn, and Co. For example, M can be Ga, Ga and Al, Ga and Mn, Ga and Co, or the like.

For example, an In—Ga—Zn—O-based material with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn—O-based material with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, bulk defects can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

When the oxide semiconductor layer and an oxide insulating layer which is a base are in contact with each other, the interface state between the insulating layer 102 and the oxide semiconductor layer 106 and oxygen deficiency in the oxide semiconductor layer 106 can be reduced. Change in the threshold voltage of the transistor 151 over time can be reduced due to the reduction of the interface state and the oxygen deficiency.

In the source region and the drain region in the transistor 151, the buffer layers 107a and 107b having n-type conductivity are formed on the side which is in contact with the oxide semiconductor layer 106. The parasitic resistance between each of the oxide semiconductor layer 106 and the source electrode layer 108a, and the oxide semiconductor layer 106 and the drain electrode layer 108b can be reduced by providing the buffer layers. Consequently, on-state current of the transistor can be increased and frequency characteristics of a circuit can be improved. These effects are noticeable particularly when the channel length of the transistor is less than or equal to 5 μm. Here, the parasitic resistance is reduced mainly by a reduction of the contact resistance between the oxide semiconductor layer 106 and the source electrode layer 108a or the drain electrode layer 108b.

For a material which can be used for the buffer layers 107a and 107b having n-type conductivity, metal oxide such as indium oxide (an In—O-based material), indium tin oxide (an In—Sn—O-based material), indium zinc oxide (an In—Zn—O-based material), tin oxide (a Sn—O-based material), zinc oxide (a Zn—O-based material), tin zinc oxide (a Sn—Zn—O-based material) is typically used. One or more elements selected from aluminum (Al), gallium (Ga), and silicon (Si) may be contained in the above metal oxide. Alternatively, titanium oxide (a Ti—O-based material), titanium niobium oxide (a Ti—Nb—O-based material), molybdenum oxide (a Mo—O-based material), tungsten oxide (a W—O-based material), magnesium oxide (a Mg—O-based material), calcium oxide (a Ca—O-based material), gallium oxide (a Ga—O-based material), or the like can be used. Nitrogen (N) may be contained in the above materials.

As a metal layer used for the source electrode layer 108a and the drain electrode layer 108b, a metal film containing an element selected from aluminum, chromium, copper, tantalum, titanium, molybdenum, and tungsten; an alloy film containing any of the above elements as its component (e.g., a titanium nitride film, a molybdenum nitride film, or a tungsten nitride film); or a stacked layer of any of the above films can be used. For example, a structure may be used in which a film of a refractory metal such as titanium, molybdenum, or tungsten or a nitride film of any of them (e.g., a titanium nitride film, a molybdenum nitride film, or a tungsten nitride film) may be provided on one surface or both surfaces of a metal film such as an aluminum film or a copper film.

When a source electrode and a drain electrode are in contact with a gate insulating layer, it is preferable to use a metal film which is less likely to extract oxygen as the source electrode and the drain electrode in order to prevent a reduction in the withstand voltage of the gate insulating layer. For the metal film, molybdenum, tungsten, or the like can be used. Note that in the case where the source electrode and the drain electrode are a stacked layer, at least a side in contact with the gate insulating layer may be the metal film.

For the gate insulating layer 112, silicon oxide, silicon nitride, silicon oxynitride, silicon nitride oxide, aluminum oxide, aluminum nitride, aluminum oxynitride, aluminum nitride oxide, hafnium oxide, gallium oxide, or lanthanum oxide, or a mixed material thereof can be used. The gate insulating layer 112 can be formed by a plasma CVD method, a sputtering method, or the like. The structure of the gate insulating layer 112 is not limited to a single-layer structure, and may be a layered structure of a plurality of the above materials.

It is preferable that an insulating material containing the same kind of component as the oxide semiconductor layer be used for the gate insulating layer 112. Such a material enables the state of the interface with the oxide semiconductor layer to be kept well. Here, containing "the same kind of component as the oxide semiconductor layer" means containing one or more elements selected from constituent elements of the oxide semiconductor layer. For example, in the case where the oxide semiconductor layer is formed using an In—Ga—Zn-based oxide semiconductor material, gallium oxide or the like is given as such an insulating material containing the same kind of component as the oxide semiconductor layer.

For the gate electrode layer 114, a metal material such as molybdenum, titanium, tantalum, tungsten, aluminum, copper, neodymium, or scandium; a nitride of any of these materials; or an alloy material containing any of these materials as its main component can be used. The gate electrode layer 114 may have a single-layer structure or a layered structure of any of the above materials.

Although not illustrated, an insulating layer may be provided over the transistor 151. A material similar to that of the insulating layer 102 can be used for this insulating layer. In order to electrically connect the source electrode layer 108a or the drain electrode layer 108b and a wiring, an opening may be formed in the gate insulating layer 112 and the like. A second gate electrode may further be provided below the oxide semiconductor layer 106. Note that it is not always necessary but preferable to process the oxide semiconductor layer 106 into an island shape.

Next, an example of manufacturing steps of the transistor 151 illustrated in FIGS. 1A to 1C will be described.

Figure 2A:
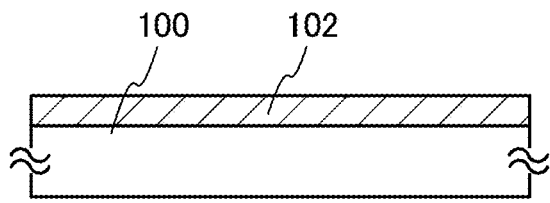
FIGS. 2A to 2E are process cross-sectional views illustrating a manufacturing method of a semiconductor device.

First, the insulating layer 102 serving as a base film is formed over the substrate 100 having an insulating surface (see FIG. 2A). The insulating layer 102 has a function of preventing diffusion of an impurity element from the substrate 100. The insulating layer 102 can be formed of a film selected from a silicon nitride film; a silicon oxide film; a silicon nitride oxide film; a silicon oxynitride film; and an aluminum oxide film, a gallium oxide film, or a gallium aluminum oxide film which is expressed by $Ga_xAl_{2-x}O_{3+y}$, ($0 \leq x \leq 2$ and $0<y<1$, i.e., x is greater than or equal to 0 and less than or equal to 2 and y is greater than 0 and less than 1). The structure of the base film is not limited to a single-layer structure, and may be a layered structure of films selected from the above films.

Here, a substrate having heat resistance enough to withstand at least heat treatment performed later can be used for the substrate 100. For example, a glass substrate of barium borosilicate glass, aluminoborosilicate glass, or the like; a ceramic substrate; a quartz substrate; or a sapphire substrate can be used. A single crystal semiconductor substrate or a polycrystalline semiconductor substrate made of silicon, silicon carbide, or the like; a compound semiconductor substrate made of silicon germanium or the like; an SOI substrate; or the like may be used as the substrate 100.

A flexible substrate may alternatively be used as the substrate 100. A substrate provided with a separation layer may alternatively be used as the substrate 100. In the latter case, a transistor including an oxide semiconductor layer is manufactured in accordance with a method disclosed below and then the transistor is transferred to a flexible substrate.

Next, an oxide semiconductor film having a thickness of greater than or equal to 2 nm and less than or equal to 200 nm, preferably greater than or equal to 5 nm and less than or equal to 30 nm is formed over the insulating layer 102.

As described above, a film represented by the chemical formula, $InMO_3(ZnO)_m$ (m>0, where m is not an integer), can be used as the oxide semiconductor film. Here, an In—Ga—Zn—O film is formed by a sputtering method.

As the film formation target used for a sputtering method, metal oxide with the following composition ratio of $In_2O_3$:$Ga_2O_3$:$ZnO$=1:1:1 [molar ratio] is used. Alternatively, metal oxide with the composition ratio of $In_2O_3$:$Ga_2O_3$:$ZnO$=1:1:2 [molar ratio] may be used.

In the case where an In—Zn—O-based material is used for an oxide semiconductor, a target to be used has a composition ratio of In:Zn=50:1 to 1:2 in an atomic ratio ($In_2O_3$:$ZnO$=25:1 to 1:4 in a molar ratio), preferably In:Zn=20:1 to 1:1 in an atomic ratio ($In_2O_3$:$ZnO$=10:1 to 1:2 in a molar ratio), more preferably In:Zn=1.5:1 to 15:1 in an atomic ratio ($In_2O_3$:$ZnO$=3:4 to 15:2 in a molar ratio). For example, in a target used for formation of an In—Zn—O-based oxide semiconductor which has an atomic ratio of In:Zn:O=X:Y:Z, the relation of Z>1.5X+Y is satisfied.

Further in the case where an In—Sn—Zn—O-based material is used for the oxide semiconductor, a target to be used preferably has a composition ratio of In:Sn:Zn=2:1:3 in an atomic ratio.

The fill rate of the film formation target is greater than or equal to 90% and less than or equal to 100%, preferably greater than or equal to 95% and less than or equal to 100%. With the use of the film formation target with high fill rate, a dense oxide semiconductor film can be formed.

As the sputtering gas, a rare gas (typically, argon), oxygen, or a mixed gas of a rare gas and oxygen can be used. It is preferable to use a high-purity gas from which impurities such as hydrogen, water, a hydroxyl group, and hydride are removed as the sputtering gas.

The oxide semiconductor film is preferably formed in the state where the substrate is heated. The substrate is held in a film formation chamber kept under reduced pressure, and film formation is performed in the state where the substrate temperature is set to higher than or equal to 100° C. and lower than or equal to 600° C., preferably higher than or equal to 200° C. and lower than or equal to 400° C.; thus, the impurity concentration in the oxide semiconductor film can be reduced.

In order to remove moisture remaining in the film formation chamber, an entrapment vacuum pump such as a cryopump, an ion pump, or a titanium sublimation pump is preferably used. As an exhaustion unit, a turbo molecular pump to which a cold trap is added may be used. In the film formation chamber which is evacuated with a cryopump, a hydrogen atom, a compound containing a hydrogen atom such as water, a compound containing a carbon atom, and the like are evacuated, whereby the impurity concentration in the oxide semiconductor film formed in the film formation chamber can be reduced.

As one example of the film formation condition, the following is given: the distance between the substrate and the target is 100 mm, the pressure is 0.6 Pa, the direct-current (DC) power is 0.5 kW, and the atmosphere is an oxygen atmosphere (the proportion of the oxygen flow is 100%). When a pulsed direct-current power source is used, powder substances (also referred to as particles or dust) that are generated in film formation can be reduced and the film thickness can be uniform.

Figure 2B:
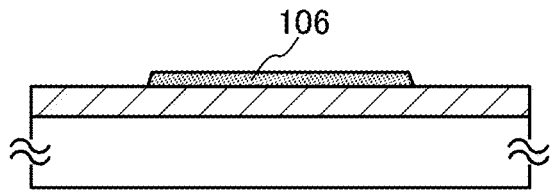

Next, the oxide semiconductor film is processed into island-shaped oxide semiconductor layer 106 by a first photolithography step and an etching step (see FIG. 2B).

Note that a resist mask used in the photolithography step may be formed by an inkjet method. Formation of the resist mask by an inkjet method needs no photomask; thus, manufacturing cost can be reduced.

Here, the etching of the oxide semiconductor film may be either dry etching or wet etching. Alternatively, both of them may be used. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used.

Then, dehydration or dehydrogenation of the oxide semiconductor layer 106 is performed through first heat treatment. In this specification, the term "dehydration or dehydrogenation" refers to not only elimination of water or a hydrogen molecule but also elimination of a hydrogen atom, a hydroxyl group, or the like.

Through this heat treatment, excessive hydrogen (including water and a hydroxyl group) is removed, so that an impurity level in energy gap of the oxide semiconductor layer 106 can be reduced. The temperature of the heat treatment is higher than or equal to 250° C. and lower than or equal to 650° C., preferably higher than or equal to 350° C. and lower than or equal to 500° C., more preferably higher than or equal to 390° C. and lower than or equal to 460° C. The length of time of the heat treatment may be about an hour as long as the temperature is in the above favorable range. The heat treatment can be performed through rapid thermal annealing (RTA) treatment in an atmosphere of an inert gas (such as nitrogen, helium, neon, or argon) at a temperature from higher than or equal to 500° C. and lower than or equal to 750° C. (or a temperature lower than or equal to the strain point of the glass substrate) for more than or equal to 1 minute and less than or equal to 10 minutes, preferably at 650° C. for more than or equal to 3 minutes and less than or equal to 6 minutes. A method for the heat treatment may be determined by the practitioner as appropriate. Note that the timing of heat treatment for the dehydration or dehydrogenation of the oxide semiconductor layer 106 is not limited to this timing and may be performed plural times, for example, before and after a photolithography step or a film formation process. In that case, the heat treatment may be performed in an atmosphere containing oxygen.

The heat treatment performed on the oxide semiconductor may be performed on the oxide semiconductor film which has not yet been processed into the island-shaped oxide semiconductor layer. In that case, a photolithography step is performed after the heat treatment. The heat treatment may be performed after the source electrode layer and the drain electrode layer are formed over the island-shaped oxide semiconductor layer as long as the oxide semiconductor is formed.

Next, a buffer layer and a metal layer are formed over the insulating layer 102 and the oxide semiconductor layer 106. The above described materials can be used for the buffer layer and the metal layer. Here, a single layer of indium tin oxide and a single layer of tungsten are formed for the buffer layer and the metal layer respectively, by a sputtering method.

Figure 2C:
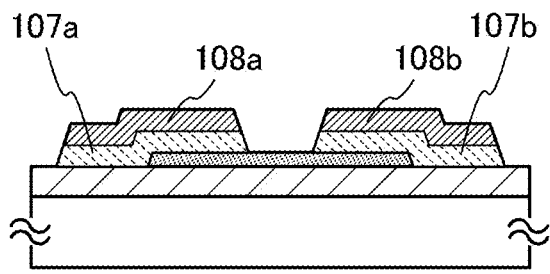

Next, a resist mask is formed over the metal layer by a second photolithography step. The metal layer and the buffer layer are selectively etched, so that the source region including the buffer layer 107a and the source electrode layer 108a and the drain region including the buffer layer 107b and the drain electrode layer 108b are formed. Then, the resist mask is removed (see FIG. 2C).

Note that the etching of the source region and the drain region is performed so that a portion of the oxide semiconductor layer 106 which is to be etched is minimized However, it is difficult to obtain etching conditions under which only the metal layer and the buffer layer are etched. In some cases, the oxide semiconductor layer 106 is partly etched so as to have a groove portion (a recessed portion) by the etching of the metal layer and the buffer layer. The source electrode layer 108a and the drain electrode layer 108b may be formed to provide steps over the buffer layer 107a and the buffer layer 107b.

Figure 2D:
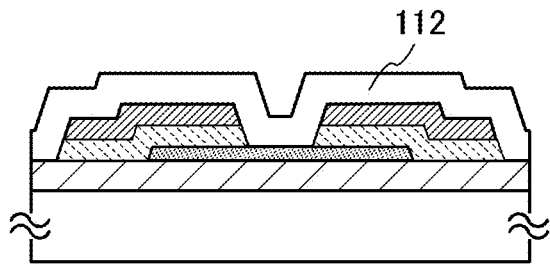

Next, the gate insulating layer 112 is formed over the source region, the drain region, and the oxide semiconductor layer 106 (see FIG. 2D). Here, a layer of silicon oxide is formed for the gate insulating layer 112 by a sputtering method.

For the formation of the gate insulating layer 112, a high-density plasma CVD method using microwaves (e.g., with a frequency of 2.45 GHz) is preferably employed because a high-quality insulating layer which is dense and has high breakdown voltage can be formed. The oxide semiconductor layer is formed in close contact with the high-quality gate insulating layer, whereby the interface state density can be reduced.

Moreover, it is possible to use as the gate insulating layer which is an insulating layer whose quality and characteristics of the interface with the oxide semiconductor layer are improved by heat treatment performed after the formation of the insulating layer. In any case, the gate insulating layer 112 is preferably formed using an insulating layer that can reduce the interface state density with the oxide semiconductor layer to form a favorable interface, as well as having favorable film quality.

Second heat treatment is preferably performed after the gate insulating layer 112 is formed. The second heat treatment is performed at temperature of higher than or equal to 250° C. and lower than or equal to 700° C., preferably higher than or equal to 350° C. and lower than or equal to 600° C. or lower than the strain point of the substrate.

The second heat treatment may be performed under an atmosphere of an oxidizing gas or an inert gas. Note that it is preferable that water, hydrogen, and the like be not contained in the atmosphere of oxidizing gas or an inert gas. Further, the purity of the gas introduced into a heat treatment apparatus is preferably set to higher than or equal to 6N (99.9999%), more preferably higher than or equal to 7N (99.99999%) (that is, the impurity concentration is lower than or equal to 1 ppm, preferably lower than or equal to 0.1 ppm).

The second heat treatment is performed while the oxide semiconductor layer 106 and the gate insulating layer 112 containing oxygen are in contact with each other. Thus, oxygen which is one of main components of the oxide semiconductor can be supplied from the gate insulating layer 112 containing oxygen to the oxide semiconductor layer 106. Consequently, oxygen deficiency in the oxide semiconductor layer 106 and an interface state between the oxide semiconductor layer 106 and the gate insulating layer 112 can be reduced. At the same time, deficiency in the gate insulating layer 112 can also be reduced.

Note that there is no particular limitation on the timing of the second heat treatment as long as it is after the gate insulating layer 112 is formed. For example, the second heat treatment may be performed after the gate electrode layer 114 is formed.

Figure 2E:
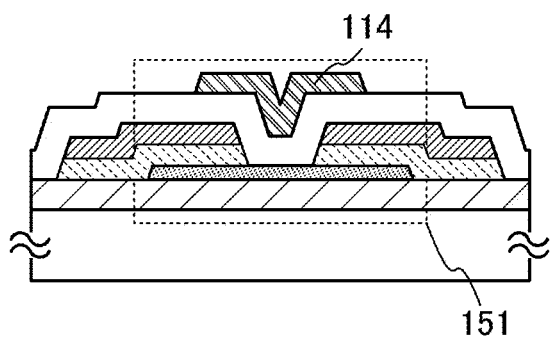

Next, a conductive film is formed and then the gate electrode layer 114 is formed through a third photolithography step and an etching step (see FIG. 2E). Here, a stacked layer of tungsten and tantalum nitride is formed as the conductive film by a sputtering method.

Although not illustrated, an insulating layer may be formed over the gate insulating layer 112 and the gate electrode layer 114. As the insulating layer, an inorganic insulating film such as a silicon oxide film; a silicon oxynitride film; an aluminum oxynitride film; or an aluminum oxide film, a gallium oxide film, or a gallium aluminum oxide film which is expressed by $Ga_xAl_{2-x}O_{3+y}$ ($0 \leq x \leq 2$ and $0 < y < 1$, i.e., x is greater than or equal to 0 and less than or equal to 2 and y is greater than 0 and less than 1) can be used.

A protective insulating layer for improving reliability may be further formed over the insulating layer. As the protective insulating layer, an inorganic insulating film such as a silicon nitride film, an aluminum nitride film, a silicon nitride oxide film, or an aluminum nitride oxide film can be used.

A planarization insulating film may be formed over the insulating layer and the protective insulating layer in order to reduce surface unevenness due to the transistor. For the planarization insulating film, an organic material such as polyimide, acrylic, or benzocyclobutene can be used. Other than such organic materials, it is also possible to use a low-dielectric constant material (a low-k material) or the like. Note that the planarization insulating film may be formed by stacking a plurality of insulating films formed from these materials.

Through the above steps, the transistor 151 is formed.

As described above, a semiconductor device having favorable characteristics can be provided.

This embodiment can be implemented in appropriate combination with the structures described in the other embodiments.

Embodiment 2

A semiconductor device (also referred to as a display device) with a display function can be manufactured using the transistor an example of which is described in Embodiment 1. Some or all of driver circuits which include the transistor can be formed over a substrate where a pixel portion is formed, whereby a system-on-panel can be obtained.

Figure 3A:
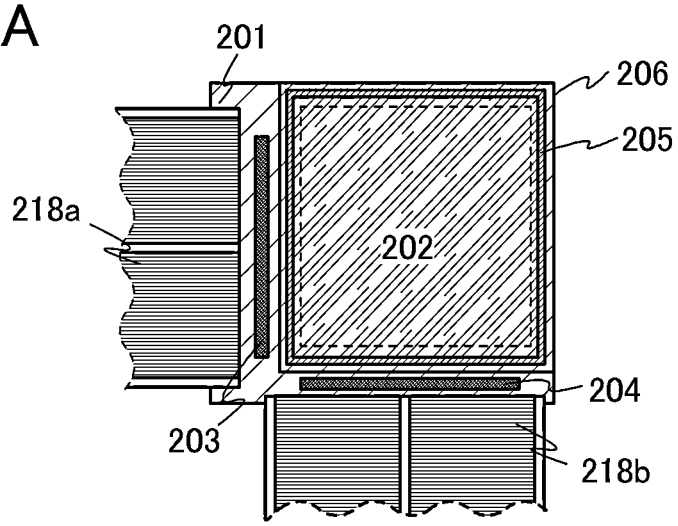
FIGS. 3A to 3C are plan views each illustrating one embodiment of a semiconductor device.

In FIG. 3A, a sealant 205 is provided to surround a pixel portion 202 provided over a first substrate 201, and the pixel portion 202 is sealed with the sealant 205 between the first substrate 201 and a second substrate 206. In FIG. 3A, a scan line driver circuit 204 and a signal line driver circuit 203 each are formed using a single crystal semiconductor or a polycrystalline semiconductor mounted in a region different from the region surrounded by the sealant 205 over the first substrate 201. Various signals and potentials are supplied to the signal line driver circuit 203 and the scan line driver circuit 204 or the pixel portion 202 through flexible printed circuits (FPCs) 218a and 218b.

Figure 3B:
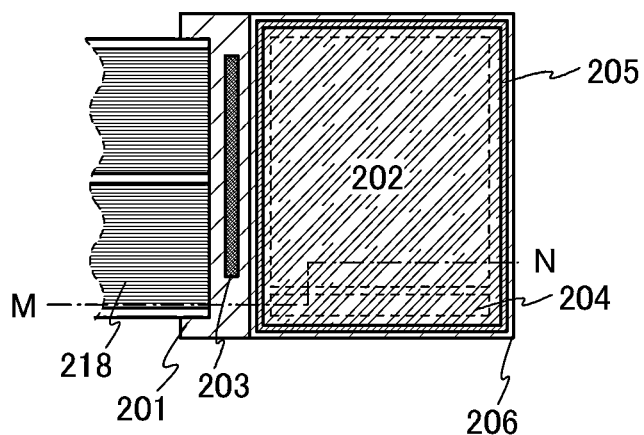
Figure 3C:
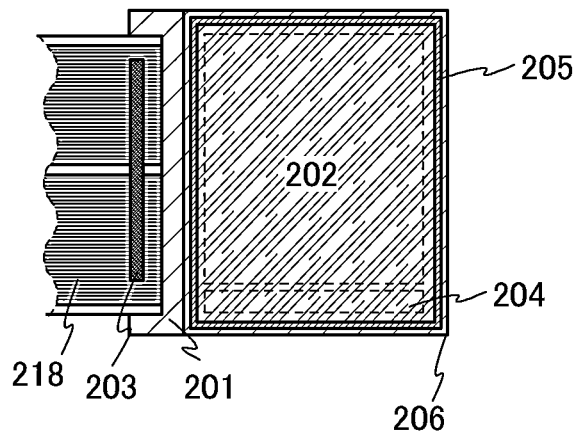

In FIGS. 3B and 3C, the sealant 205 is provided to surround the pixel portion 202 and the scan line driver circuit 204 which are provided over the first substrate 201. The second substrate 206 is provided over the pixel portion 202 and the scan line driver circuit 204. Thus, the pixel portion 202 and the scan line driver circuit 204 are sealed together with a display element by the first substrate 201, the sealant 205, and the second substrate 206. In FIGS. 3B and 3C, the signal line driver circuit 203 is formed using a single crystal semiconductor or a polycrystalline semiconductor and mounted in a region different from the region surrounded by the sealant 205 over the first substrate 201. In FIGS. 3B and 3C, various signals and potentials are supplied to the signal line driver circuit 203 which is separately formed, the scan line driver circuit 204, and the pixel portion 202 through an FPC 218.

Although FIGS. 3B and 3C each illustrate the example in which the signal line driver circuit 203 is formed separately and mounted on the first substrate 201, the present invention is not limited to this structure. The scan line driver circuit may be formed separately and then mounted, or only part of the signal line driver circuit or part of the scan line driver circuit may be formed separately and then mounted.

Note that a connection method of a separately formed driver circuit is not particularly limited, and a chip on glass (COG) method, a wire bonding method, a tape automated bonding (TAB) method, or the like can be used. FIG. 3A shows an example in which the signal line driver circuit 203 and the scan line driver circuit 204 are mounted by a COG method. FIG. 3B shows an example in which the signal line driver circuit 203 is mounted by a COG method. FIG. 3C shows an example in which the signal line driver circuit 203 is mounted by a TAB method.

Note that a display device in this specification means an image display device, a display device, or a light source (including a lighting device). The display device includes any of the following modules: a module provided with an FPC or a TAB tape; a module in which a printed wiring board is provided in the end of a TAB tape; and a module in which an integrated circuit (IC) is mounted directly on a display element by a COG method.

The pixel portion and the scan line driver circuit which are provided over the first substrate include a plurality of transistors and the transistor an example of which is described in Embodiment 1 can be used as one of the transistors.

As the display element provided in the display device, a liquid crystal element (also referred to as a liquid crystal display element) or a light-emitting element (also referred to as a light-emitting display element) can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used.

Figure 4:
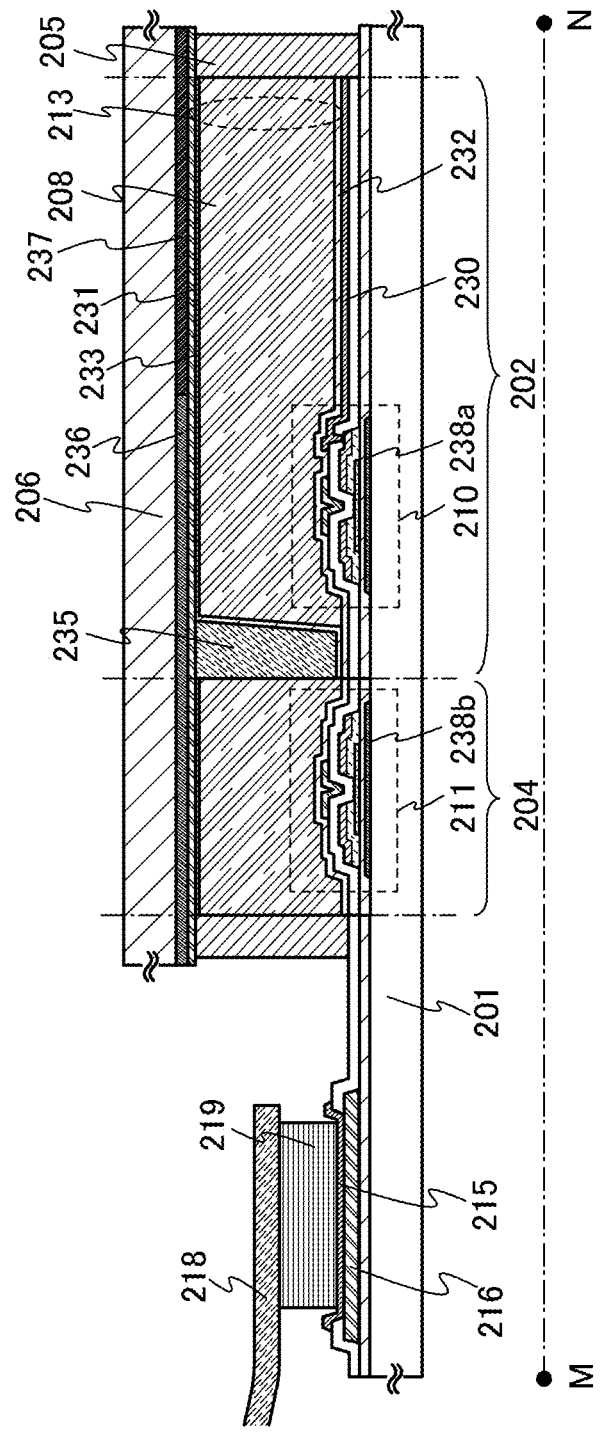
FIG. 4 is a cross-sectional view illustrating one embodiment of a semiconductor device.
Figure 5:
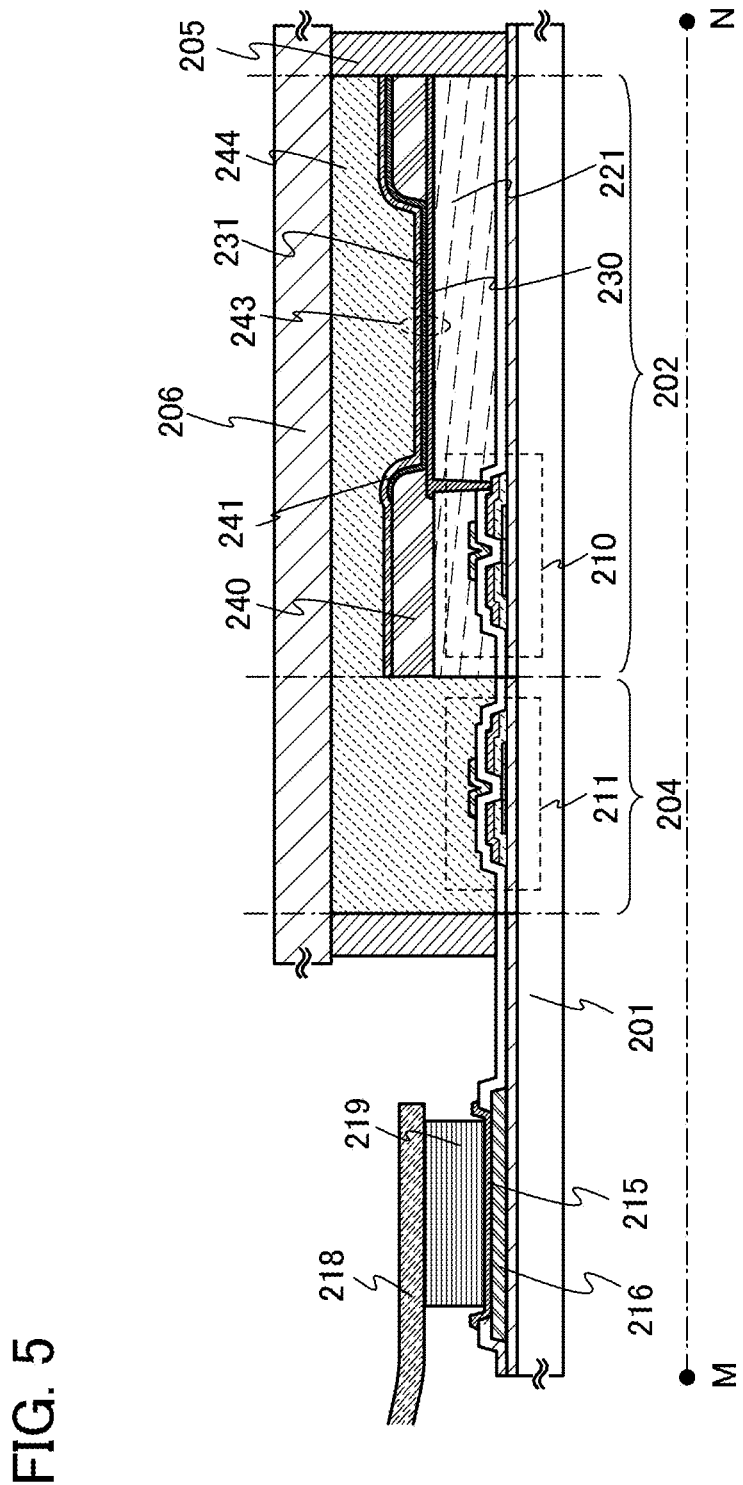
FIG. 5 is a cross-sectional view illustrating one embodiment of a semiconductor device.
Figure 6:
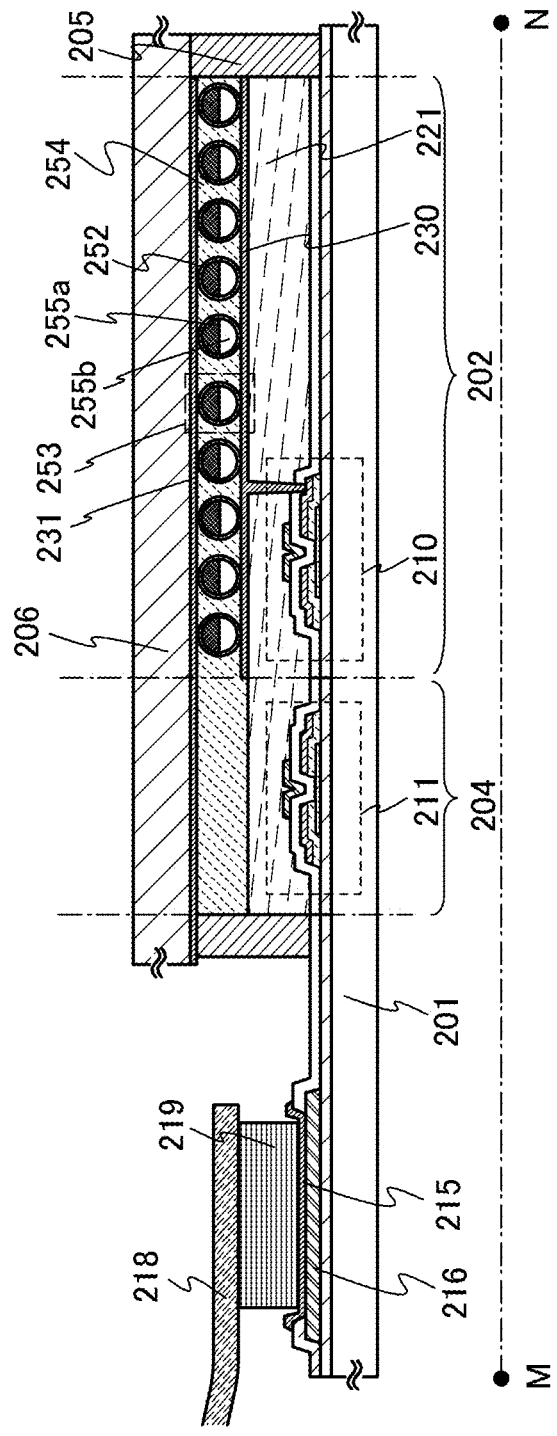
FIG. 6 is a cross-sectional view illustrating one embodiment of a semiconductor device.

One embodiment of the display device is described with reference to FIG. 4, FIG. 5, and FIG. 6. FIG. 4, FIG. 5, and FIG. 6 correspond to cross-sectional views along line M-N in FIG. 3B.

As illustrated in FIG. 4, FIG. 5, and FIG. 6, the semiconductor device includes a connection terminal electrode 215 and a terminal electrode 216. The connection terminal electrode 215 and the terminal electrode 216 are electrically connected to a terminal included in the FPC 218 through an anisotropic conductive layer 219.

The connection terminal electrode 215 is formed of the same conductive layer as a first electrode layer 230. The terminal electrode 216 is formed of the same conductive layer as a source electrode and a drain electrode of a transistor 210 and a transistor 211.

Each of the pixel portion 202 and the scan line driver circuit 204 provided over the first substrate 201 includes a plurality of transistors. In FIG. 4, FIG. 5, and FIG. 6, the transistor 210 included in the pixel portion 202 and the transistor 211 included in the scan line driver circuit 204 are illustrated as an example.

In this embodiment, the transistor described in Embodiment 1 can be applied to the transistor 210 and the transistor 211. The transistors 210 and 211 have excellent electric characteristics; thus, a display device having an excellent display capability can be provided.

The transistor 210 provided in the pixel portion 202 is electrically connected to the display element to form a display panel. There is no particular limitation on the kind of the display element as long as display can be performed, and various kinds of display elements can be employed.

An example of a liquid crystal display device using a liquid crystal element as the display element is illustrated in FIG. 4. In FIG. 4, a liquid crystal element 213 is a display element including the first electrode layer 230, a second electrode layer 231, and a liquid crystal layer 208. Note that insulating layers 232 and 233 serving as alignment layers are provided so that the liquid crystal layer 208 is interposed therebetween. The second electrode layer 231 is formed on the second substrate 206 side. The first electrode layer 230 and the second electrode layer 231 are stacked with the liquid crystal layer 208 interposed therebetween. Although a structure is illustrated in which a color filter 237 for performing color display is provided on a counter substrate side, the color filter 237 may be provided on the substrate side where the transistors are formed. The color filter 237 is unnecessary in the case where color display is not performed.

Light-blocking layers 238a and 238b are provided in a lower layer of the transistors 210 and 211 respectively. The light-blocking layers 238a and 238b block light emitted from a back light or the like to channel formation regions of the transistors. There is no particular limitation on a material which can be used for the light-blocking layers as long as the material has a high light-blocking property. For example, in the case where a metal layer is used, the light-blocking layers can function as second gate electrodes.

In addition, a light-blocking layer 236 is formed in a region on the counter substrate side, which is over the transistors 210 and 211. The light-blocking layer 236 blocks light emitted to the transistors. The light-blocking layer 236 can function as a black matrix in a display region; thus, display quality can be improved.

By blocking light emitted to the transistors 210 and 211 as described above, light deterioration phenomenon that is a problem of a transistor using an oxide semiconductor can be suppressed and deterioration in threshold voltage can be suppressed for a long time.

A spacer 235 is a columnar spacer obtained by selective etching of an insulating layer and is provided in order to control the thickness (a cell gap) of the liquid crystal layer 208. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment layer is unnecessary may be used. A blue phase is one of liquid crystal phases, which is generated just before a cholesteric phase changes into an isotropic phase while temperature of cholesteric liquid crystal is increased. Since the blue phase is generated only within a relatively narrow range of temperature, a liquid crystal composition containing a chiral agent at greater than or equal to 5 wt. %, a UV curable resin, and the like are mixed and which is irradiated with ultraviolet light is used for the liquid crystal layer in order to improve the range of temperature. This liquid crystal layer shows a blue phase with a wide range of temperature and has a short response time of 1 msec or less. Further, this liquid crystal layer is optically isotropic; therefore, alignment treatment is not necessary and viewing angle dependence is small. In addition, since an alignment layer does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. Note that in the case where a blue phase is used, one embodiment of the present invention is not limited to the structure in FIG. 4, and a structure of a so-called horizontal electric field mode may be employed, in which the second electrode layer 231 is formed on the substrate side where the first electrode layer 230 is formed.

The specific resistivity of the liquid crystal material is greater than or equal to $1\times10^9$ Ω·cm, preferably greater than or equal to $1\times10^{11}$ Ω·cm, further preferably greater than or equal to $1\times10^{12}$ Ω·cm. The value of the specific resistivity in this specification is measured at 20° C.

The size of a storage capacitor provided in the liquid crystal display device is set in consideration of the leakage current of the transistor provided in the pixel portion or the like so that a charge can be held for a predetermined period. By using a transistor including a high-purity oxide semiconductor layer, it is enough to provide a storage capacitor having a capacitance that is less than or equal to $\frac{1}{3}$, preferably less than or equal to $\frac{1}{5}$ of a liquid crystal capacitance of each pixel.

In the transistor used in this embodiment, which uses a highly-purified oxide semiconductor layer, the current in an off state (the off-state current) can be made small. Therefore, an electrical signal such as an image signal can be held for a long period, and a writing interval can be set long when the power is on. Consequently, frequency of refresh operation can be reduced, which leads to an effect of suppressing power consumption.

The field-effect mobility of the transistor including a highly-purified oxide semiconductor layer used in this embodiment can be relatively high, whereby high-speed operation is possible. Therefore, by using the transistor in a pixel portion of a liquid crystal display device, a high-quality image can be provided. In addition, a driver circuit portion can be formed over the same substrate by using the transistor, whereby the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. For example, an MVA (multi-domain vertical alignment) mode, a PVA (patterned vertical alignment) mode, or an ASV mode can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue respectively). For example, R, G, B, and W (W corresponds to white), or R, G, B, and one or more of yellow, cyan, magenta, and the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, so that current flows. The carriers (electrons and holes) are recombined, and thus the light-emitting organic compound is excited. The light-emitting organic compound returns to a ground state from the excited state, thereby emitting light. An element which emits light with such a mechanism is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as the display element is illustrated in FIG. 5. A light-emitting element 243 which is a display element is electrically connected to the transistor 210 provided in the pixel portion 202. The structure of the light-emitting element 243 is not limited to the layered structure including the first electrode layer 230, an electroluminescent layer 241, and the second electrode layer 231, which is illustrated in FIG. 5. The structure of the light-emitting element 243 can be changed as appropriate depending on a direction in which light is extracted from the light-emitting element 243, or the like.

A partition wall 240 can be formed using an organic insulating material or an inorganic insulating material. It is particularly preferable that the partition wall 240 be formed using a photosensitive resin material to have an opening over the first electrode layer 230 so that a sidewall of the opening is formed as a tilted surface with continuous curvature.

The electroluminescent layer 241 may be formed with either a single layer or a stacked layer of a plurality of layers.

A protective layer may be formed over the second electrode layer 231 and the partition wall 240 in order to prevent entry of oxygen, hydrogen, moisture, carbon dioxide, or the like into the light-emitting element 243. As a protective layer, a silicon nitride layer, a silicon nitride oxide layer, a DLC layer, or the like can be formed. In a space sealed with the first substrate 201, the second substrate 206, and the sealant 205, a filler 244 is provided and tightly sealed. In such a manner, it is preferable that the light-emitting element be packaged (sealed) with a protective film (such as a laminate film or an ultraviolet curable resin film) or a cover material with high air-tightness and little degasification so that the light-emitting element is not exposed to the outside air.

As the filler 244, an ultraviolet curable resin or a thermosetting resin can be used in addition to an inert gas such as nitrogen or argon, and polyvinyl chloride (PVC), acrylic, polyimide, an epoxy resin, a silicone resin, polyvinyl butyral (PVB), ethylene vinyl acetate (EVA), or the like can be used.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection layer. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material thereof.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 6 illustrates active matrix electronic paper as one embodiment of a semiconductor device. The electronic paper in FIG. 6 is an example of a display device using a twisting ball display system.

Between the first electrode layer 230 connected to the transistor 210 and the second electrode layer 231 provided on the second substrate 206, spherical particles 253 each of which includes a black region 255a, a white region 255b, and a cavity 252 around the regions which is filled with liquid, are provided. A space around the spherical particles 253 is filled with a filler 254 such as a resin. The second electrode layer 231 corresponds to a common electrode (counter electrode). The second electrode layer 231 is electrically connected to a common potential line.

Note that in FIGS. 4 to 6, a flexible substrate as well as a glass substrate can be used as the first substrate 201 and the second substrate 206. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

An insulating layer 221 can be formed using an organic insulating material or an inorganic insulating material. Note that an organic insulating material having heat resistance, such as an acrylic resin, a polyimide, a benzocyclobutene-based resin, a polyamide, or an epoxy resin is preferably used as a planarizing insulating layer. As well as such organic insulating materials, it is possible to use a low-dielectric material (a low-k material), a siloxane-based resin, phosphorus silicate glass (PSG), boron phosphorus silicate glass (BPSG), or the like. Note that the insulating layer 221 may be formed by stacking a plurality of insulating layers formed using any of these materials.

There is no particular limitation on the method for forming the insulating layer 221, and the insulating layer 221 can be formed, depending on a material thereof, by a sputtering method, a spin coating method, a dipping method, a spray coating method, a droplet discharging method (e.g., an ink-jet method, screen printing, or offset printing), a roll coating method, a curtain coating method, a knife coating method, or the like.

The first electrode layer 230 and the second electrode layer 231 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

Either or both of the first electrode layer 230 and the second electrode layer 231 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon is added.

Either the first electrode layer 230 or the second electrode layer 231 can be formed using one or more materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of these metals; or a nitride of these metals.

A conductive composition containing a conductive high molecule (also referred to as a conductive polymer) can be used for either of the first electrode layer 230 and the second electrode layer 231. As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken owing to static electricity or the like, a protective circuit for protecting the driver circuit is preferably provided. The protective circuit is preferably formed using a nonlinear element.

As described above, by using any of the transistors described in Embodiment 1, a display device having better display performance can be provided. Note that the transistors described in Embodiment 1 can be applied to not only semiconductor devices having the display functions described above but also semiconductor devices having a variety of functions, such as a power device which is mounted on a power supply circuit, a semiconductor integrated circuit such as an LSI and a memory and a semiconductor device having an image sensor function of reading information of an object.

This embodiment can be implemented in appropriate combination with the structures described in the other embodiments.

Embodiment 3

A semiconductor device which is one embodiment of the present invention can be applied to a variety of electronic appliances (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a personal digital assistant, an audio reproducing device, and a large-sized game machine such as a pachinko machine. Examples of electronic appliances each including the semiconductor device described in Embodiment 1 or 2 will be described.

Figure 7A:
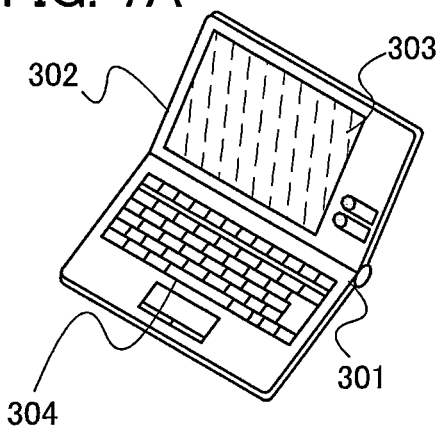
FIGS. 7A to 7F are diagrams each illustrating an electronic appliance.

FIG. 7A illustrates a notebook PC. The notebook PC includes a main body 301, a housing 302, a display portion 303, a keyboard 304, and the like.

Figure 7B:
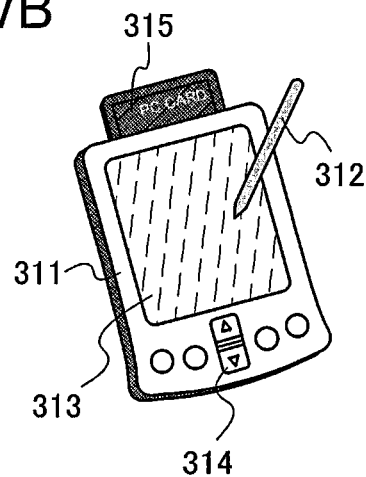

FIG. 7B illustrates a personal digital assistant (PDA). The personal digital assistant includes a display portion 313, an external interface 315, an operation button 314, and the like in a main body 311. A stylus 312 is included as an accessory for operation.

Figure 7C:
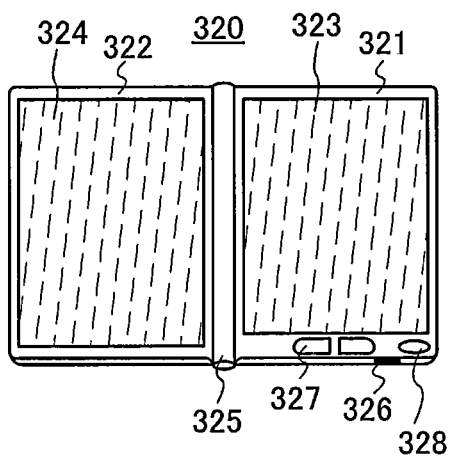

FIG. 7C illustrates an example of an electronic book device. For example, an e-book reader 320 includes two housings, a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 and a display portion 324 are incorporated in the housing 321 and the housing 322 respectively. The display portion 323 and the display portion 324 may display one image or different images. When the display portion 323 and the display portion 324 display different images, for example, text can be displayed on a display portion on the right side (the display portion 323 in FIG. 7C) and photographs and pictures can be displayed on a display portion on the left side (the display portion 324 in FIG. 7C).

FIG. 7C illustrates an example in which the housing 321 is provided with an operation portion and the like. For example, the housing 321 is provided with a power switch 326, operation keys 327, a speaker 328, and the like. With the operation keys 327, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 320 may have a function of an electronic dictionary.

The e-book reader 320 may send and receive data wirelessly. Through wireless communication, desired book data or the like can be purchased and downloaded from an electronic book server.

Figure 7D:
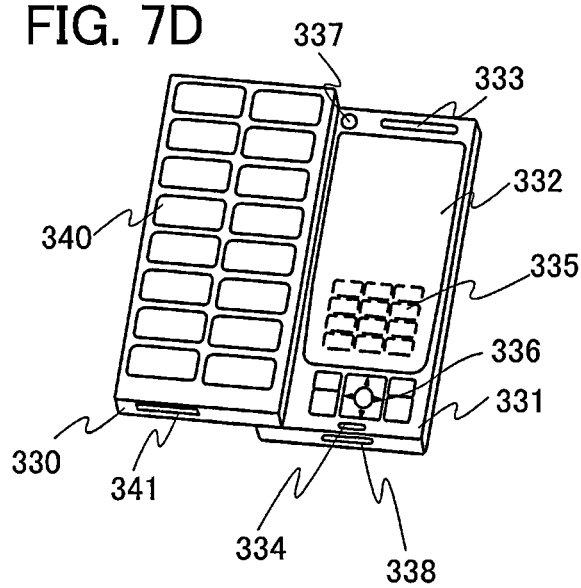

FIG. 7D illustrates a mobile phone, which includes two housings, a housing 330 and a housing 331. The housing 331 includes a display panel 332, a speaker 333, a microphone 334, a pointing device 336, a camera 337, an external connection terminal 338, and the like. In addition, the housing 330 includes a solar cell 340 having a function of charge of the personal digital assistant, an external memory slot 341, and the like. Further, an antenna is incorporated in the housing 331.

Further, the display panel 332 is provided with a touch panel. A plurality of operation keys 335 which are displayed as images is illustrated by dashed lines in FIG. 7D. Note that the mobile phone includes a boosting circuit for raising a voltage output from the solar cell 340 to a voltage necessary for each circuit.

The display direction of the display panel 332 is changed as appropriate depending on a usage pattern. Further, the mobile phone is provided with the camera 337 on the same surface as the display panel 332, and thus it can be used as a video phone. The speaker 333 and the microphone 334 can be used for videophone calls, recording and playing sound, and the like as well as voice calls. Moreover, the housings 330 and 331 in a state where they are opened as illustrated in FIG. 7D can be slid so that one overlaps the other; therefore, the size of the mobile phone can be reduced, which makes the mobile phone suitable for being carried.

The external connection terminal 338 can be connected to various types of cables such as a charging cable and a USB cable, and charging and data communication with a personal computer are possible. Moreover, a larger amount of data can be stored by inserting a recording medium to the external memory slot 341 and can be moved.

Further, in addition to the above functions, an infrared communication function, a television reception function, or the like may be provided.

Figure 7E:
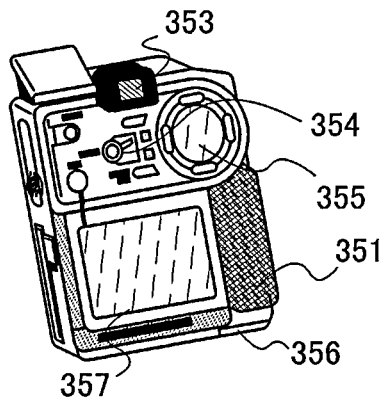

FIG. 7E illustrates a digital video camera, which includes a main body 351, a display portion (A) 357, an eyepiece 353, an operation switch 354, a display portion (B) 355, a battery 356, and the like.

Figure 7F:
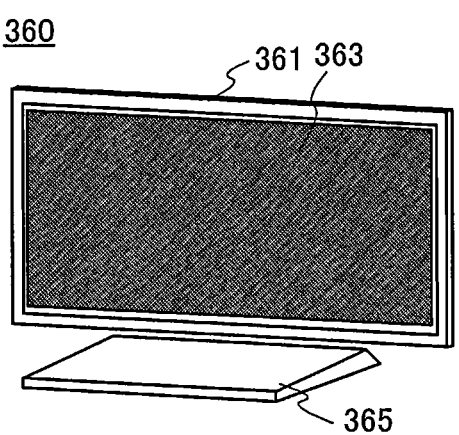

FIG. 7F illustrates an example of a television set. In a television set 360, a display portion 363 is incorporated in a housing 361. The display portion 363 can display images. Here, the housing 361 is supported by a stand 365.

The television set 360 can be operated by an operation switch of the housing 361 or a separate remote controller. Further, the remote controller may be provided with a display portion for displaying data output from the remote controller.

Note that the television set 360 is provided with a receiver, a modem, and the like. Moreover, when the display device is connected to a communication network with or without wires via the modem, one-way (from a sender to a receiver) or two-way (between a sender and a receiver or between receivers) information communication can be performed.

This embodiment can be implemented in appropriate combination with the structures described in the other embodiments.

Example

In this example, transistors including an n-type buffer layer described in Embodiment 1 were manufactured. Results of comparison between the electric characteristics and reliability of the transistors and those of transistors having a conventional structure will be described.

Transistor whose structure corresponds to a structure in FIG. 8A were manufactured in accordance with a manufacturing method of Embodiment 1. The following were included in the transistors: a 300 nm-thick silicon oxide film as the insulating layer 102 which is a base layer; an In—Ga—Zn—O-based film whose channel formation region has a thickness of 25 nm as the oxide semiconductor layer 106; a 5 nm-thick indium tin oxide (hereinafter referred to as ITO) film containing silicon (Si) or a 5 nm-thick indium zinc oxide (hereinafter referred to as IZO) film as the buffer layers 107a and 107b; a 100 nm-thick tungsten film as the source electrode layer 108a and the drain electrode layer 108b; a 15 nm-thick silicon oxynitride film as the gate insulating layer 112; and a 15 nm-thick tantalum nitride film and a 135 nm-thick tungsten film are stacked in this order from the gate insulating layer 112 side as the gate electrode layer 114.

Although not illustrated in FIG. 8A, as an interlayer insulating film, a 300 nm-thick silicon oxide film was formed over the gate electrode layer 114 and the gate insulating layer 112 by a sputtering method. A 50 nm-thick titanium film, a 100 nm-thick aluminum film, and a 5 nm-thick titanium film were formed as wiring layers each of which is connected to the source electrode layer 108a, the drain electrode layer 108b, and the gate electrode layer 114 respectively, through contact holes formed in the interlayer insulating film. The wiring layers were formed as extraction electrodes which were used in obtaining the electric characteristics of the transistors.

First, parasitic resistance between the semiconductor layer and the source/drain electrodes was obtained by a transmission line model (TLM) method using data of L length dependence of on-resistance of the manufactured transistors (L=0.4 µm, 0.5 µm, 0.6 µm, 0.7 µm, 0.8 µm, 0.9 µm, 2 µm, 3 µm, 5 µm, and 10 µm, W=10 µm). Field-effect mobility was obtained by the I-V characteristics (a drain voltage was 3 V and a gate voltage was −6 V to +6 V) of the manufactured transistors (L/W=0.8 µm/10 µm). The results are shown in Table 1. Here, values of the field effect mobility are the largest value when the gate voltage is in the above range. Twelve of the transistors were measured for each of three structures (the one which does not include a buffer layer, the one which includes a buffer layer using ITO containing Si, and the one which includes a buffer layer using IZO), and the medium value of the field effect mobility of the transistors were shown.

TABLE 1

| | Buffer Layer | | |
| --- | --- | --- | --- |
| | Not included | ITO containing Si (5 nm) | IZO (5 nm) |
| Parasitic Resistance between Semiconductor Layer and Source/Drain Electrodes [Ω] | 860 | 520 | 540 |
| Field Effect Mobility [cm²/Vs] | 12.4 | 13.5 | 13.7 |

From the results in Table 1, the parasitic resistance between the semiconductor layer and the source/drain electrodes of the transistors including an n-type buffer layer were reduced by about 40%. This shows that including an n-type buffer layer is effective. In addition, it was confirmed that on-state current characteristics was improved and the field effect mobility were improved by about 9% to 10% owing to the effect.

Moreover, a negative gate BT (bias-temperature) stress test was performed on transistors (L/W=3 μm/50 μm) manufactured in a manner similar to that of the above transistors. The test was performed at 150° C. for an hour under the following conditions: sources of the transistors were set to GND; +0.1 V was applied to drains of the transistors; +3 V (+2 MV/cm), −3 V (−2 MV/cm), +9 V (+6 MV/cm), or −9 V (−6 MV/cm) was applied to gates of the transistors.

Figure 9A:
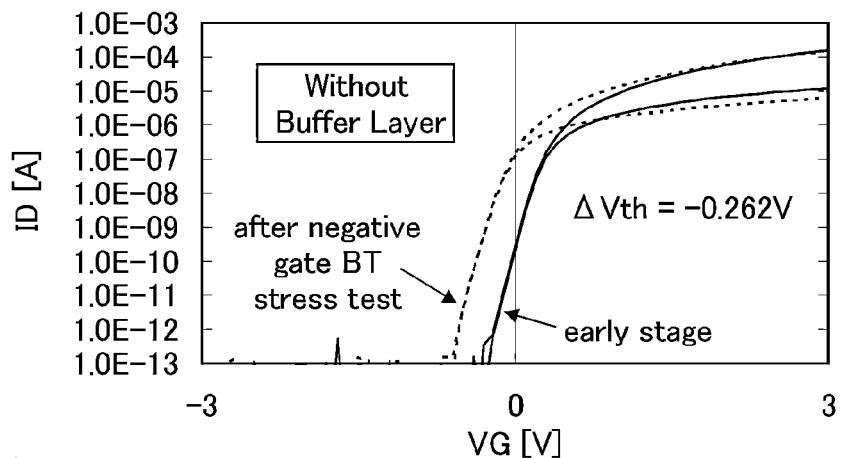
FIGS. 9A to 9C are graphs each showing I-V characteristics of a transistor before and after a negative gate BT stress is applied.
Figure 9B:
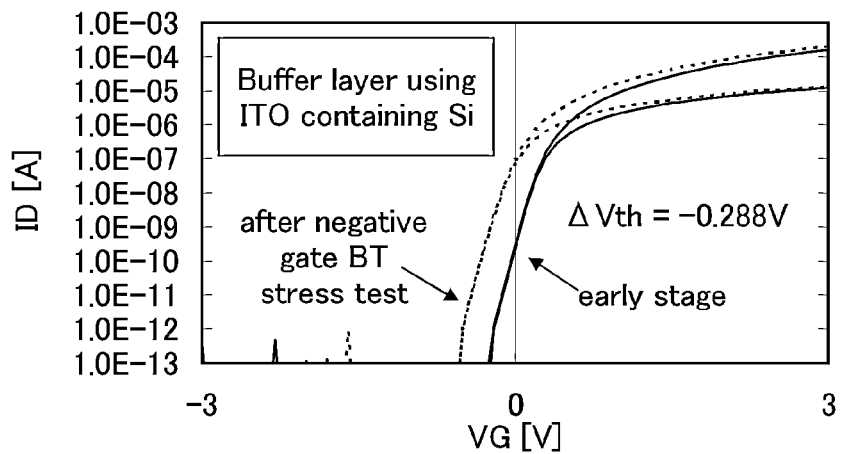
Figure 9C:
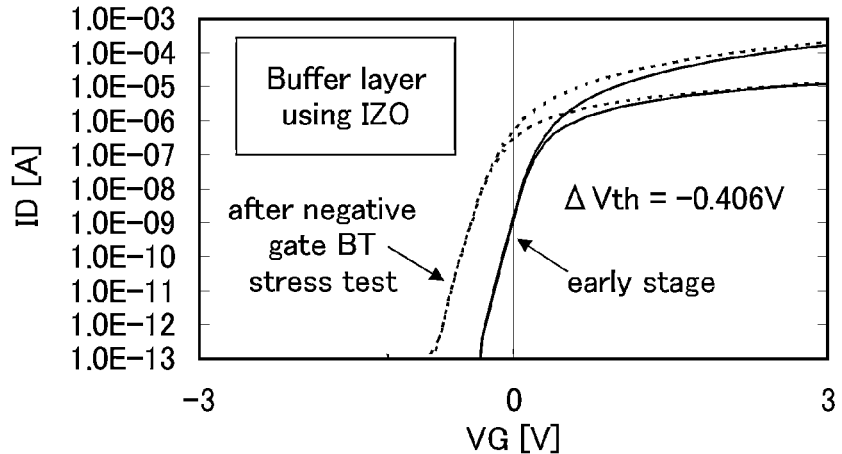

No differences were seen between the transistors in which +3 V, −3 V, and +9 V were applied to the gates among the above tests, whether buffer layers were included or not. In contrast, in the transistors in which −9 V was applied, deterioration in on-state current (a current when the gate voltage was 3 V) of the transistor including a buffer layer was reduced as shown in FIGS. 9A to 9C. The deterioration rates of the on-state current shown in FIGS. 9A to 9C are described in Table 2. Here, the on-state current in an early stage is defined as a current value when the gate voltage is 3 V. The on-state current after the negative gate BT stress test is defined as a current value when the gate voltage is 3 V−ΔVth (the difference between the threshold voltage in the early stage and the threshold voltage after the stress test).

TABLE 2

| | | Buffer Layer | |
| --- | --- | --- | --- |
| | Not included | ITO containing Si (5 nm) | IZO (5 nm) |
| Deterioration Rate when Drain Voltage = 0.1 V | 54.4% | 3.3% | 12.8% |
| Deterioration Rate when Drain Voltage = 3 V | 20.8% | 1.2% | 1.8% |

These results show that a transistor which includes a buffer layer also has an effect of greatly reducing the deterioration rate of on-state current compared with a transistor which does not include a buffer layer. In addition, it is found that the deterioration rate of on-state current can be more suppressed when ITO containing Si is used as a buffer layer compared to the case where IZO is used.

Scientific calculation was performed in order to investigate the cause of the negative gate BT stress test result (suppression of a reduction in on-state current).

Figure 13A:
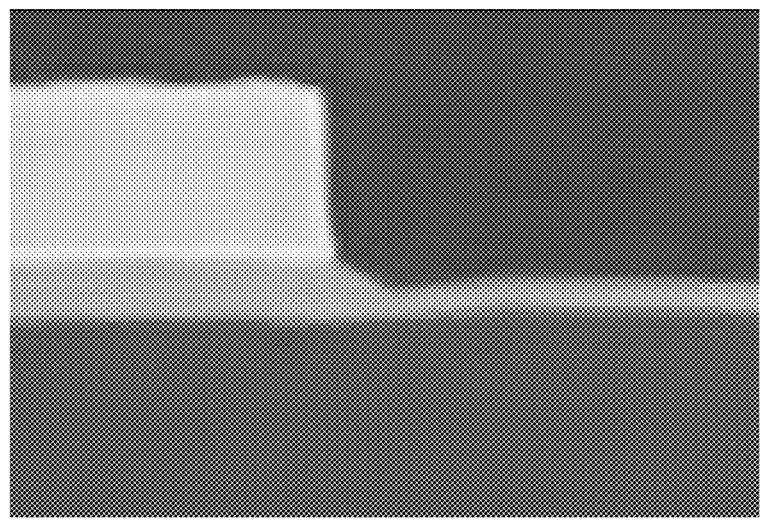
FIGS. 13A and 13B are a cross-sectional TEM image and a schematic view of a transistor including a buffer layer.
Figure 13B:
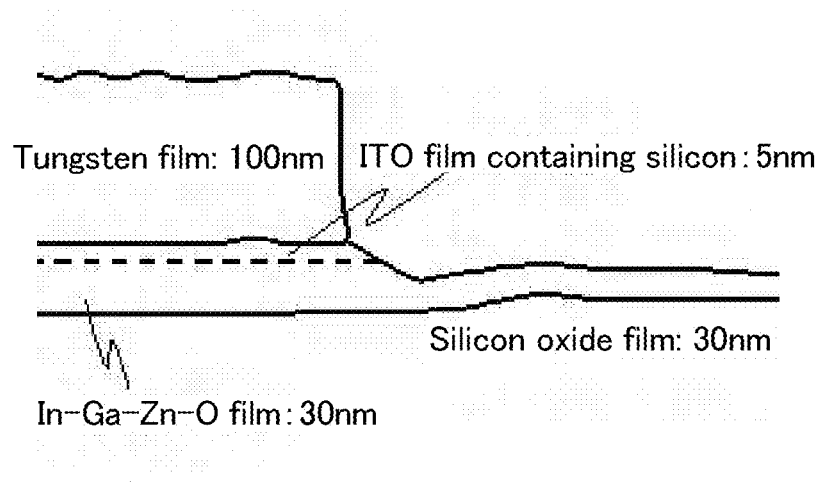

Models used in the scientific calculation have basically the structure illustrated in FIG. 8A. Considering an actual device structure, a reduction in a thickness of a channel formation region in an oxide semiconductor layer was set to 5 nm in a transistor of a model which does not include a buffer layer; taper angle of edges was set to 30° and a reduction in a thickness of a channel formation region in an oxide semiconductor layer was set to 10 nm in a transistor of a model which includes a buffer layer according to the result of cross-sectional TEM observation of a transistor shown in FIG. 13A. Note that FIG. 13B is a schematic view for describing FIG. 13A.

The size of the transistors was assumed to be L/W=3/50 μm; the thickness of a gate insulating film (silicon oxynitride), 15 nm; a band gap (Eg) of an oxide semiconductor, 3.15 eV; the electron affinity (χ), 4.3 eV; the dielectric constant, 15; and the electron mobility, 10 cm$^2$/Vs. An oxide semiconductor layer serving as a channel formation region was assumed to be uniformly amorphous. An n-type buffer layer was assumed to be an oxide semiconductor including donors at high concentration ($1 \times 10^{20}$/cm$^3$). Values of the band gap and the electron affinity of the n-type buffer layer were set to the same value as those of the oxide semiconductor serving as a channel formation region and the value of the electron mobility was determined so that the resistivity was $3 \times 10^{-3}$ Ω·cm. The work function of a gate metal was 4.9 eV (the gate was assumed to be tungsten) and the work function of a source/drain metal was 4.5 eV (the source-drain metal was assumed to be molybdenum). A device simulation tool Sentaurus Device manufactured by Synopsys. Inc. was used for the calculation.

Figure 10:
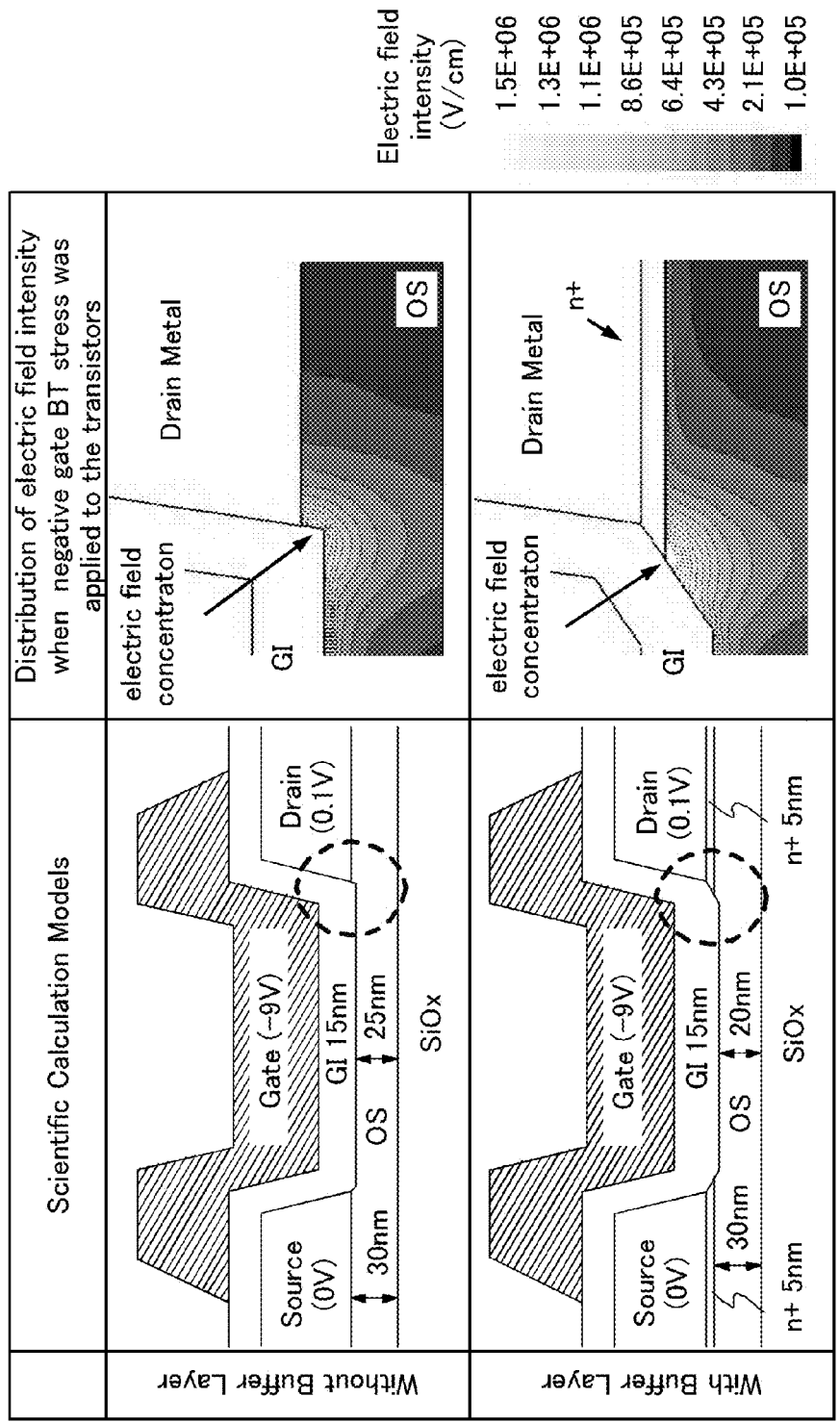
FIG. 10 illustrates scientific calculation models and distribution of an electric field intensity when a negative gate BT stress is applied.

FIG. 10 shows diagrams of distribution of an electric field intensity in the case where a negative gate BT stress (a gate voltage was −9 V and a drain voltage was +0.1 V at 150° C.) was applied to the transistors. As a result of the scientific calculation, it was found that electric field concentration occurs in part of the oxide semiconductor layer as shown by arrows in the figure. Note that "OS" in the figure indicates an oxide semiconductor layer and "GI" in the figure indicates a gate insulating layer.

Figure 11:
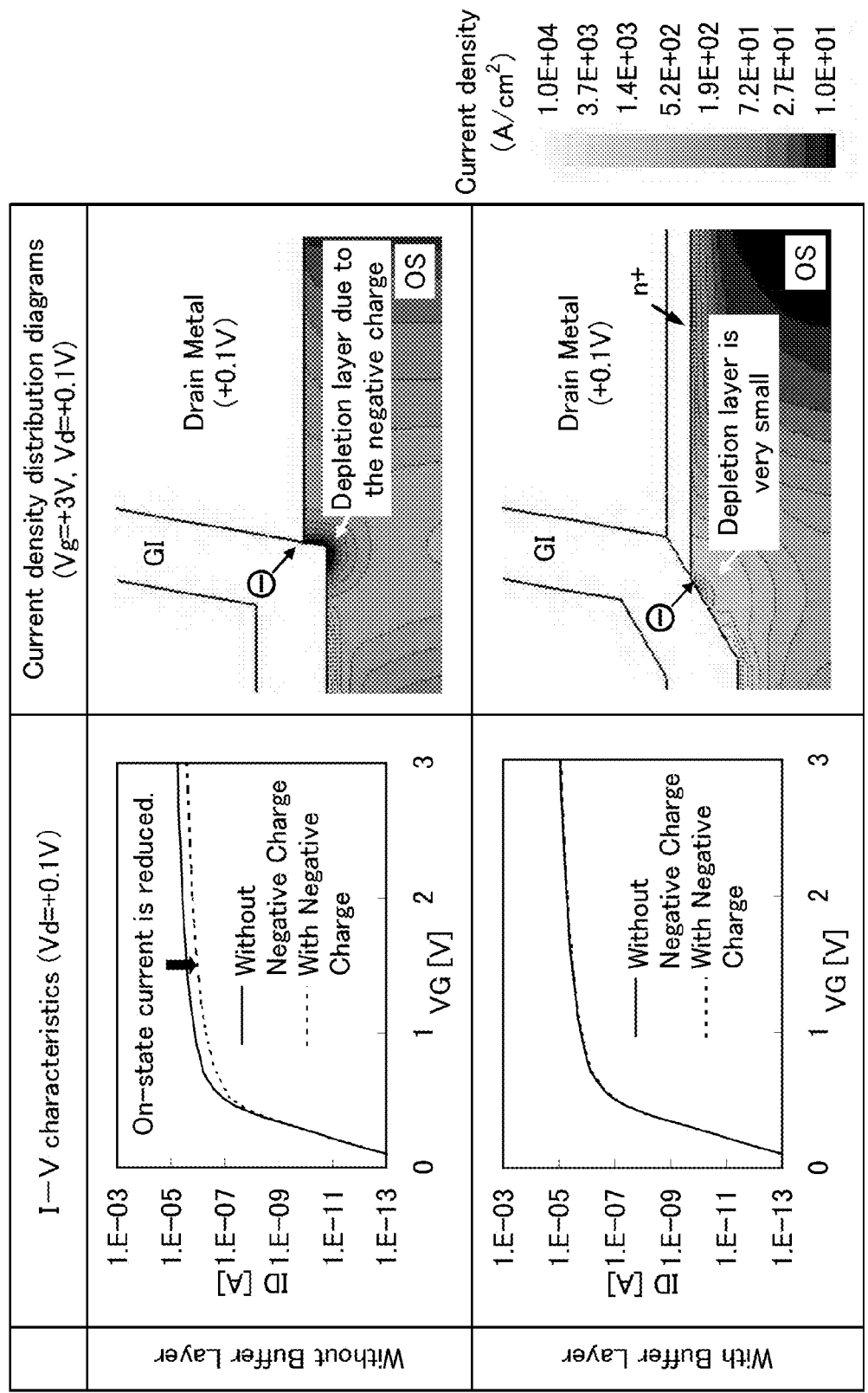
FIG. 11 illustrates I-V characteristics of a transistor and distribution of current density when a negative charge is fixed (at a drain voltage of +0.1 V).
Figure 12:
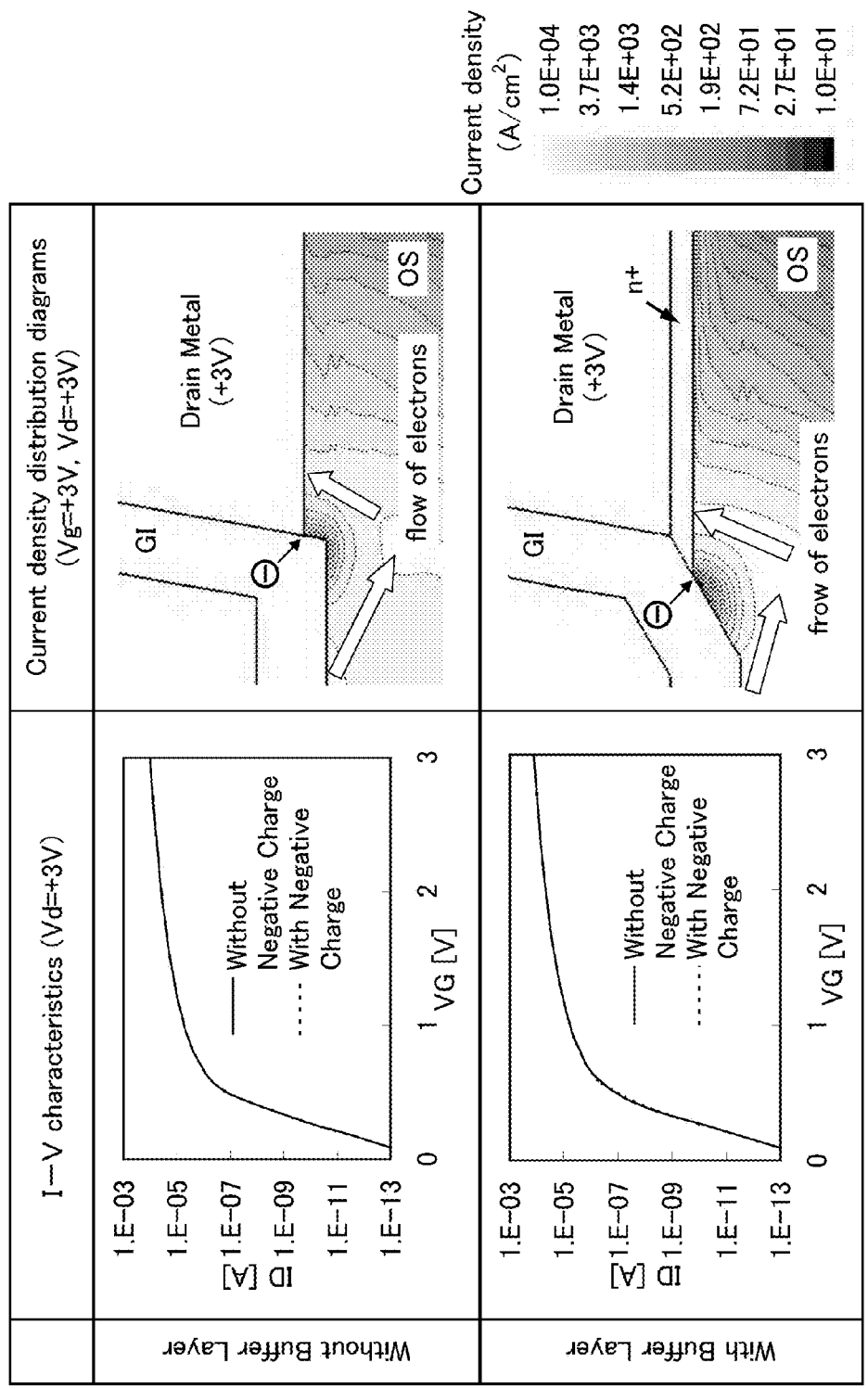
FIG. 12 illustrates I-V characteristics of a transistor and distribution of current density when a negative charge is fixed (at a drain voltage of +3 V).

Next, FIG. 11 and FIG. 12 show calculation results in the case where an electron trap was assumed to be generated by a negative gate BT stress and a negative charge was fixed in a position where electric field concentration was generated (an interface between an oxide semiconductor layer and a gate insulating layer).

The surface density of the negative charge was $1 \times 10^{13}$ cm$^{-2}$. I-V characteristics in the state where the negative charge was fixed and the state where the negative charge was not fixed were calculated. Thus, whether a phenomenon of deterioration in on-state current at the time of performing the negative gate BT stress test reappeared or not was confirmed. Note that the negative charge was fixed to the same position on a source side so as to be symmetric with a drain side.

As a result, as shown in FIG. 11, on-state current was greatly reduced in a model which does not include a buffer layer when a drain voltage was +0.1 V, whereby the I-V characteristics in FIG. 9A was reproduced. Note that a reduction in on-state current was confirmed in a model which includes a buffer layer in FIG. 11 but the amount of the reduction is very little. In view of this point, it can be said that the I-V characteristics in FIGS. 9B and 9C are reproduced.

In current density distribution diagrams in FIG. 11 (a gate voltage is +3 V and a drain voltage is +0.1 V), an electron at an interface of a gate insulating layer is repelled by the negative charge and a depletion layer is formed surrounding the negative charge in the model which does not include a buffer layer. On-state current is reduced because this depletion layer exists in a path of current. On the other hand, in the model which includes a buffer layer, it is considered that an electron is supplied from an n-type buffer layer in the vicinity, so that a depletion layer is very small even when the negative charge exists; thus, a reduction of on-state current is suppressed.

In current density distribution diagrams in FIG. 12 (a gate voltage is +3 V and a drain voltage is +3 V), it is found that current detours a depletion layer due to the negative charge and flows even in a model which does not include a buffer layer. When a drain voltage is high (in a saturation region), current flows in a position which is distant from an interface of a gate insulating layer due to the electric field of the drain; therefore, it can be considered that the current detours the negative charge and flows. Consequently, it can be said that a reduction in on-state current due to a negative gate BT stress is less likely to be caused when a drain voltage is high.

As described above, the phenomenon of the reduction in on-state current after performing the negative gate BT stress test shown in FIGS. 9A to 9C can be explained by the scientific calculation results.

This example can be implemented in appropriate combination with any of the structures described in the other embodiments.

EXPLANATION OF REFERENCE

100: substrate, 102: insulating layer, 106: oxide semiconductor layer, 107a: buffer layer, 107b: buffer layer, 108a: source electrode layer, 108b: drain electrode layer, 112: gate insulating layer, 114: gate electrode layer, 151: transistor, 201: substrate, 202: pixel portion, 203: signal line driver circuit, 204: scan line driver circuit, 205: sealant, 206: substrate, 208: liquid crystal layer, 210: transistor, 211: transistor, 213: liquid crystal element, 215: connection terminal electrode, 216: terminal electrode, 218: FPC, 218a: FPC, 218b: FPC, 219: anisotropic conductive layer, 221: insulating layer, 230: electrode layer, 231: electrode layer, 232: insulating layer, 233: insulating layer, 235: spacer, 236: light-blocking layer, 237: color filter, 238a: light-blocking layer, 238b: light-blocking layer, 240: partition, 241: electroluminescent layer, 243: light-emitting element, 244: filler, 252: cavity, 253: spherical particle, 254: filler, 255a: black region, 255b: white region, 301: main body, 302: housing, 303: display portion, 304: keyboard, 311: main body, 312: stylus, 313: display portion, 314: operation key, 315: external interface, 320: e-book reader, 321: housing, 322: housing, 323: display portion, 324: display portion, 325: hinge, 326: power switch, 327: operation key, 328: speaker, 330: housing, 331: housing, 332: display panel, 333: speaker, 334: microphone, 335: operation key, 336: pointing device, 337: camera, 338: external connection terminal, 340: solar cell, 341: external memory slot, 351: main body, 353: eyepiece, 354: operation switch, 355: display portion (B), 356: battery, 357: display portion (A), 360: television set, 361: housing, 363: display portion, and 365: stand.

This application is based on Japanese Patent Application serial no. 2010-152050 filed with Japan Patent Office on Jul. 2, 2010 and Japanese Patent Application serial no. 2010-181523 filed with Japan Patent Office on Aug. 16, 2010, the entire contents of which are hereby incorporated by reference.

What is claimed is:

1. A method for manufacturing a semiconductor device, comprising the steps of:
   forming an insulating layer over a substrate having an insulating surface;
   forming an island-shaped oxide semiconductor layer over the insulating layer;
   forming a buffer layer having n-type conductivity over the island-shaped oxide semiconductor layer;
   forming a metal layer over the buffer layer;
   selectively etching the buffer layer and the metal layer to form a source region and a drain region over the island-shaped oxide semiconductor layer;
   forming a gate insulating layer over the source region, the drain region, and the island-shaped oxide semiconductor layer; and
   forming a gate electrode layer over the gate insulating layer to overlap with the island-shaped oxide semiconductor layer,
   wherein the gate insulating layer is in contact with the island-shaped oxide semiconductor layer.

2. The method for manufacturing the semiconductor device according to claim 1, wherein the metal layer is any of a single film, an alloy film, and a layered film including any of the single film and the alloy film.

3. The method for manufacturing the semiconductor device according to claim 2, wherein each of the single film and the alloy film comprises an element selected from aluminum, chromium, copper, tantalum, titanium, molybdenum, and tungsten.

4. The method for manufacturing the semiconductor device according to claim 1, wherein the buffer layer comprises a metal oxide selected from indium oxide, indium tin oxide, indium zinc oxide, tin oxide, zinc oxide, and tin zinc oxide, or a material comprising the metal oxide including one or more elements selected from aluminum, gallium, and silicon.

5. The method for manufacturing the semiconductor device according to claim 1, wherein the buffer layer comprises a material selected from titanium oxide, titanium niobium oxide, molybdenum oxide, tungsten oxide, magnesium oxide, calcium oxide, and gallium oxide.

6. The method for manufacturing the semiconductor device according to claim 1, wherein the island-shaped oxide semiconductor layer comprises at least one element selected from In, Ga, Sn, Zn, Al, Mg, Hf, and lanthanoid.

7. The method for manufacturing the semiconductor device according to claim 1, wherein the gate insulating layer contains oxygen.

8. The method for manufacturing the semiconductor device according to claim 1, wherein the metal layer provides steps over the buffer layer.

9. A method for manufacturing a semiconductor device, comprising the steps of:
   forming an insulating layer over a substrate having an insulating surface;
   forming an island-shaped oxide semiconductor layer over the insulating layer;
   forming a buffer layer having n-type conductivity over the island-shaped oxide semiconductor layer;
   forming a metal layer over the buffer layer;
   selectively etching the buffer layer and the metal layer to form a source region and a drain region over the island-shaped oxide semiconductor layer;
   forming a gate insulating layer over the source region, the drain region, and the island-shaped oxide semiconductor layer; and
   forming a gate electrode layer over the gate insulating layer to overlap with the island-shaped oxide semiconductor layer,
   wherein the gate insulating layer is in contact with the island-shaped oxide semiconductor layer, and
   wherein the island-shaped oxide semiconductor layer has a groove portion.

10. The method for manufacturing the semiconductor device according to claim 9, wherein the metal layer is any of a single film, an alloy film, and a layered film including any of the single film and the alloy film.

11. The method for manufacturing the semiconductor device according to claim 10, wherein each of the single film and the alloy film comprises an element selected from aluminum, chromium, copper, tantalum, titanium, molybdenum, and tungsten.

12. The method for manufacturing the semiconductor device according to claim 9, wherein the buffer layer comprises a metal oxide selected from indium oxide, indium tin oxide, indium zinc oxide, tin oxide, zinc oxide, and tin zinc oxide, or a material comprising the metal oxide including one or more elements selected from aluminum, gallium, and silicon.

13. The method for manufacturing the semiconductor device according to claim 9, wherein the buffer layer comprises a material selected from titanium oxide, titanium niobium oxide, molybdenum oxide, tungsten oxide, magnesium oxide, calcium oxide, and gallium oxide.

14. The method for manufacturing the semiconductor device according to claim 9, wherein the island-shaped oxide semiconductor layer comprises at least one element selected from In, Ga, Sn, Zn, Al, Mg, Hf, and lanthanoid.

15. The method for manufacturing the semiconductor device according to claim 9, wherein the gate insulating layer contains oxygen.

16. The method for manufacturing the semiconductor device according to claim 9, wherein the metal layer provides steps over the buffer layer.

17. A method for manufacturing a semiconductor device, comprising the steps of:
- forming an insulating layer over a substrate having an insulating surface;
- forming an island-shaped oxide semiconductor layer over the insulating layer;
- forming an n-type conductivity layer over the island-shaped oxide semiconductor layer;
- forming a metal layer over the n-type conductivity layer;
- selectively etching the n-type conductivity layer and the metal layer to form a source region and a drain region over the island-shaped oxide semiconductor layer;
- forming a gate insulating layer over the source region, the drain region, and the island-shaped oxide semiconductor layer; and
- forming a gate electrode layer over the gate insulating layer to overlap with the island-shaped oxide semiconductor layer,
- wherein the gate insulating layer is in contact with the island-shaped oxide semiconductor layer, and
- wherein inner side edges of the source region and the drain region are tapered.

18. The method for manufacturing the semiconductor device according to claim 17, wherein the metal layer is any of a single film, an alloy film, and a layered film including any of the single film and the alloy film.

19. The method for manufacturing the semiconductor device according to claim 17, wherein the n-type conductivity layer comprises a metal oxide selected from indium oxide, indium tin oxide, indium zinc oxide, tin oxide, zinc oxide, and tin zinc oxide, or a material comprising the metal oxide including one or more elements selected from aluminum, gallium, and silicon.

20. The method for manufacturing the semiconductor device according to claim 17, wherein the buffer layer comprises a material selected from titanium oxide, titanium niobium oxide, molybdenum oxide, tungsten oxide, magnesium oxide, calcium oxide, and gallium oxide.

21. The method for manufacturing the semiconductor device according to claim 17, wherein the island-shaped oxide semiconductor layer comprises at least one element selected from In, Ga, Sn, Zn, Al, Mg, Hf, and lanthanoid.

22. The method for manufacturing the semiconductor device according to claim 17, wherein the gate insulating layer contains oxygen.

* * * * *